United States Patent
Narai et al.

(10) Patent No.: US 9,747,994 B2
(45) Date of Patent: Aug. 29, 2017

(54) MEMORY SYSTEM

(71) Applicant: KABUSHIKI KAISHA TOSHIBA, Tokyo (JP)

(72) Inventors: Hirosuke Narai, Tokyo (JP); Toshihiko Kitazume, Kanagawa (JP); Kenichirou Kada, Kanagawa (JP); Nobuhiro Tsuji, Kanagawa (JP); Shunsuke Kodera, Kanagawa (JP); Tetsuya Iwata, Kanagawa (JP); Yoshio Furuyama, Kanagawa (JP); Shinya Takeda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/233,642

(22) Filed: Aug. 10, 2016

(65) Prior Publication Data

US 2017/0062066 A1 Mar. 2, 2017

(30) Foreign Application Priority Data

Aug. 27, 2015 (JP) .................................. 2015-167874

(51) Int. Cl.
*G11C 16/10* (2006.01)
*G11C 16/34* (2006.01)
(Continued)

(52) U.S. Cl.
CPC .......... *G11C 16/3436* (2013.01); *G11C 16/10* (2013.01); *G11C 29/00* (2013.01);
(Continued)

(58) Field of Classification Search
CPC ............................... G11C 16/10; G11C 16/26
(Continued)

(56) References Cited

U.S. PATENT DOCUMENTS 5,761,732 A * 6/1998 Shaberman ......... G06F 13/4018
711/127
7,290,109 B2 10/2007 Horii et al.
(Continued)

FOREIGN PATENT DOCUMENTS

JP 2002-245428 A 8/2002
JP 2011-248456 A 12/2011

OTHER PUBLICATIONS

Micron NAND Flash Memory Serial Peripheral. Interface(SPI) MT29F1G01 AAA DD. 2010 Micron Technology.
(Continued)

*Primary Examiner* — Michael Tran
(74) *Attorney, Agent, or Firm* — Patterson & Sheridan, LLP

(57) ABSTRACT

A memory system includes first through fifth pins connectable to a host device to output to the host device a first signal through the third pin and to receive from the host device a first chip select signal through the first pin, a second chip select signal through the second pin, a second signal through the fourth pin, and a clock signal through the fifth pin, an interface circuit configured to recognize, as a command, the second signal received through the fourth pin immediately after detecting the first or second chip select signal, and first and second memory cell arrays. The interface circuit and the first and second memory cell arrays are provided in one common package, and is configured to access the first memory cell array when detecting the first chip select signal, and to access the second memory cell array when detecting the second chip select signal.

18 Claims, 20 Drawing Sheets

(51) Int. Cl.
*G11C 29/00* (2006.01)
*H01L 23/31* (2006.01)
*H01L 23/495* (2006.01)
*H01L 23/00* (2006.01)
*G11C 29/04* (2006.01)

(52) U.S. Cl.
CPC ... *G11C 2029/0411* (2013.01); *H01L 23/3121* (2013.01); *H01L 23/49575* (2013.01); *H01L 24/48* (2013.01); *H01L 24/73* (2013.01); *H01L 2224/32145* (2013.01); *H01L 2224/32245* (2013.01); *H01L 2224/48091* (2013.01); *H01L 2224/48145* (2013.01); *H01L 2224/48247* (2013.01); *H01L 2224/73265* (2013.01); *H01L 2924/1434* (2013.01); *H01L 2924/1438* (2013.01); *H01L 2924/181* (2013.01)

(58) Field of Classification Search
USPC .................................. 365/185.22, 185.24
See application file for complete search history.

(56) References Cited

U.S. PATENT DOCUMENTS

| | | | | |
|---|---|---|---|---|
| 2004/0057297 | A1* | 3/2004 | Jang | G11C 16/20 365/200 |
| 2005/0005045 | A1* | 1/2005 | Kim | G06K 7/10297 710/74 |
| 2005/0071592 | A1* | 3/2005 | DeCaro | G06F 12/1425 711/163 |
| 2005/0201537 | A1* | 9/2005 | Honda | G06F 13/4291 379/100.17 |
| 2007/0233988 | A1* | 10/2007 | Adusumilli | G06F 13/1668 711/166 |
| 2008/0049505 | A1* | 2/2008 | Kim | G06F 13/1694 365/185.11 |
| 2009/0030535 | A1* | 1/2009 | Yang | G06F 3/16 700/94 |
| 2009/0039927 | A1* | 2/2009 | Gillingham | G06F 13/1694 327/156 |
| 2010/0161308 | A1* | 6/2010 | Norman | G11C 13/0007 703/23 |
| 2010/0182817 | A1* | 7/2010 | Koshizuka | G11C 5/04 365/51 |
| 2015/0149735 | A1* | 5/2015 | Nale | G06F 11/079 711/147 |
| 2016/0162355 | A1* | 6/2016 | Mizrachi | G06F 11/1048 714/57 |

OTHER PUBLICATIONS

TC58NVG0S3HTA00. Toshiba MOS Digital Integrated Circuit Silicon Gate CMOS. Aug. 31, 2012.
TC58BVG0S3HTA00. Toshiba MOS Digital Integrated Circuit Silicon Gate CMOS. Aug. 31, 2012.

* cited by examiner

FIG. 3

| Pin no. | Pin function |
|---|---|
| 1 | Hold input(/HOLD) / serial data output3(SO3) |
| 2 | Power supply(Vcc) |
| 3 | No connection(NC) |
| 4 | No connection(NC) |
| 5 | No connection(NC) |
| 6 | No connection(NC) |
| 7 | Chip select1(/CS1) |
| 8 | Serial data output(SO) / serial data output1(SO1) |
| 9 | Write protect(/WP) / serial data output2(SO2) |
| 10 | Ground(Vss) |
| 11 | Chip select2(/CS2) |
| 12 | No connection(NC) |
| 13 | No connection(NC) |
| 14 | No connection(NC) |
| 15 | Serial data input(SI) / serial data output0(SO0) |
| 16 | Serial clock input(SCK) |

MEMORY SYSTEM

CROSS-REFERENCE TO RELATED APPLICATION

This application is based upon and claims the benefit of priority from Japanese Patent Application No. 2015-167874, filed Aug. 27, 2015, the entire contents of which are incorporated herein by reference.

FIELD

Embodiments described herein relate generally to a memory system.

BACKGROUND

Some widely known storage devices include NAND-type flash memory.

DESCRIPTION OF THE DRAWINGS

FIG. 3 is a diagram illustrating functions of external terminals of the memory system according to the first embodiment.

DETAILED DESCRIPTION

Figure 1:
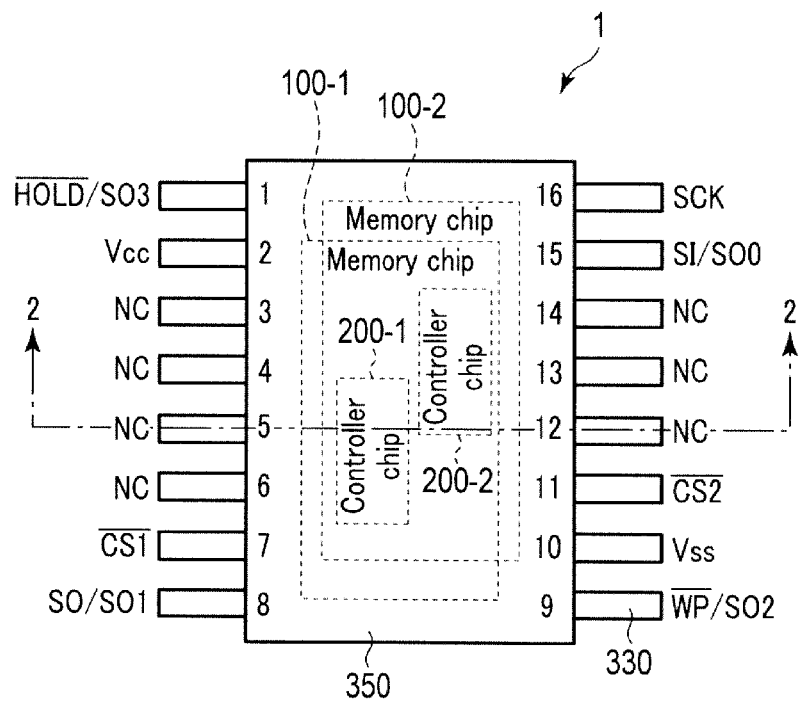
FIG. 1 is an external view of a memory system according to a first embodiment.

According to one embodiment, there is provided a memory system that allows the memory capacity thereof to be readily increased.

In general, according to one embodiment, a memory system includes first through fifth pins connectable to a host device to output to the host device a first signal through the third pin and to receive from the host device a first chip select signal through the first pin, a second chip select signal through the second pin, a second signal through the fourth pin, and a clock signal through the fifth pin, an interface circuit configured to recognize, as a command, the second signal received through the fourth pin immediately after detecting the first chip select signal or the second chip select signal, and a first memory cell array and a second memory cell array each comprising memory cells capable of holding data. The interface circuit, the first memory cell array, and the second memory cell array are provided in one common package, and is configured to access the first memory cell array when detecting the first chip select signal, and to access the second memory cell array when detecting the second chip select signal.

Hereinafter, embodiments will be described with reference to the drawings. Furthermore, in the following description, configuring elements having the same functions and configurations are assigned the respective same reference characters.

1. First Embodiment

A memory system according to a first embodiment will now be described.

1.1 Configuration

1.1.1 Entire Configuration of the Memory System

First, the entire configuration of the memory system according to the present embodiment is briefly described with reference to FIG. 1 and FIG. 2. FIG. 1 is an external view of the memory system according to the present embodiment, in particular, illustrating the appearance of an upper surface thereof as viewed from above, and FIG. 2 is a sectional view taken along line 2-2 in FIG. 1.

As illustrated, the memory system 1 includes four semiconductor chips 100-1, 100-2, 200-1, and 200-2. The semiconductor chips (memory chips) 100-1 and 100-2 include semiconductor memories, such as NAND-type flash memories, and the semiconductor chips (controller chips) 200-1 and 200-2 include controllers that respectively control the memory chips 100-1 and 100-2. The semiconductor chips 100-1, 100-2, 200-1, and 200-2 are mounted on a lead frame 300, and are then packaged while being sealed with a resin 350.

Figure 2:
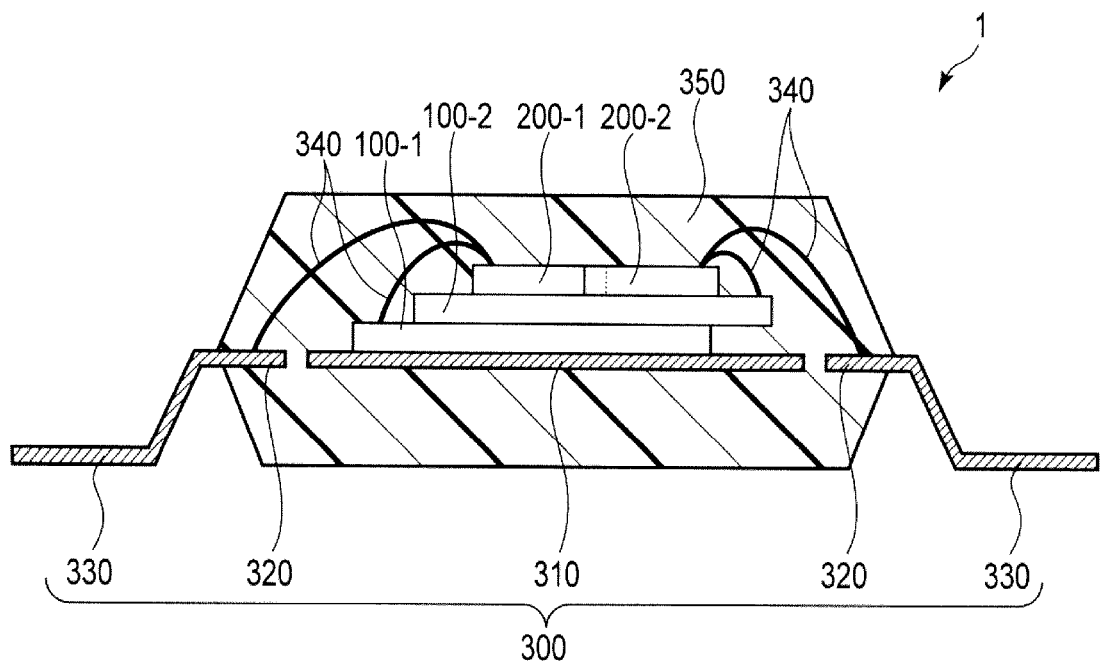
FIG. 2 is a sectional view of the memory system according to the first embodiment.

More specifically, as illustrated in FIG. 2, the memory chip 100-1 is mounted on a die pad 310 of the lead frame 300. Moreover, the memory chip 100-2 is provided on the memory chip 100-1 in a step-like manner (in other words, in such a manner that a portion of the upper surface of the memory chip 100-1 remains exposed). Then, the controller chips 200-1 and 200-2 are provided on the memory chip 100-2.

The controller chip 200-1 is connected to an inner lead 320 of the lead frame 300 by, for example, a bonding wire 340, and is also connected to the memory chip 100-1 by the bonding wirer 340. Moreover, the controller chip 200-2 is connected to an inner lead 320 of the lead frame 300 by a bonding wire 340, and is also connected to the memory chip 100-2 by the bonding wirer 340. Then, the memory chips 100-1 and 100-2, the controller chips 200-1 and 200-2, the die pad 310, the inner lead 320, and the bonding wirer 340 are sealed with, for example, a resin 350, so that one semiconductor package is formed.

The inner lead 320 is connected to an outer lead 330, which is exposed outside the resin 350. Thus, the outer lead 330 functions as an external connecting terminal (external connecting pin) of the memory system 1. In the case of an example illustrated in FIG. 1, sixteen external connecting terminals from the first pin to the sixteenth pin are arranged. The memory system 1 performs, via these pins, communication with a host device that controls the memory system 1 (more specifically, accesses the memory chips).

FIG. 3 is a diagram illustrating functions of the respective pins. As illustrated, the first pin is used to input a control signal /HOLD or to output serial data SO3. The control signal /HOLD is asserted (to a low-logic ("L") level) when the communication between the host device and the memory system 1 is temporarily stopped. The second pin receives a power-supply voltage Vcc. The third to sixth pins and the twelfth to fourteenth pins, which are unused pins, are capable of being used when it becomes necessary to send or receive some signals or data in the future, i.e., they are spare pin locations. The seventh pin receives a chip select signal /CS1. The chip select signal /CS1 is a signal used to activate the memory chip 100-1 and the controller chip 200-1 (in other words, a signal that is activated when accessing the memory chip 100-1). The eleventh pin receives a chip select signal /CS2. The chip select signal /CS2 is a signal used to activate the memory chip 100-2 and the controller chip 200-2 (in other words, a signal that is activated when accessing the memory chip 100-2). The chip select signals /CS1 and /CS2 are asserted (to the "L" level) at the timing when, for example, a host device inputs a command to the memory system 1. The eighth pin is used to output serial data (SO or SO1). The ninth pin is used to input a write protect control signal /WP or to output serial data (SO2). The control signal /WP, which is a write-protect signal, is asserted (to the "L" level) when writing to a memory chip is inhibited. The tenth pin receives a reference potential Vss. The fifteenth pin is used to input serial data (SI) or to output serial data (SO0). The sixteenth pin receives a serial clock signal SCK.

The above-described pin configuration conforms to a Serial Peripheral Interface (SPI). Then, freely selecting the first pin, the eighth pin, the ninth pin, and the fifteenth pin as pins used to output serial data enables outputting data to a host device at one-time speed, two-times speed, or four-times speed.

Figure 4:
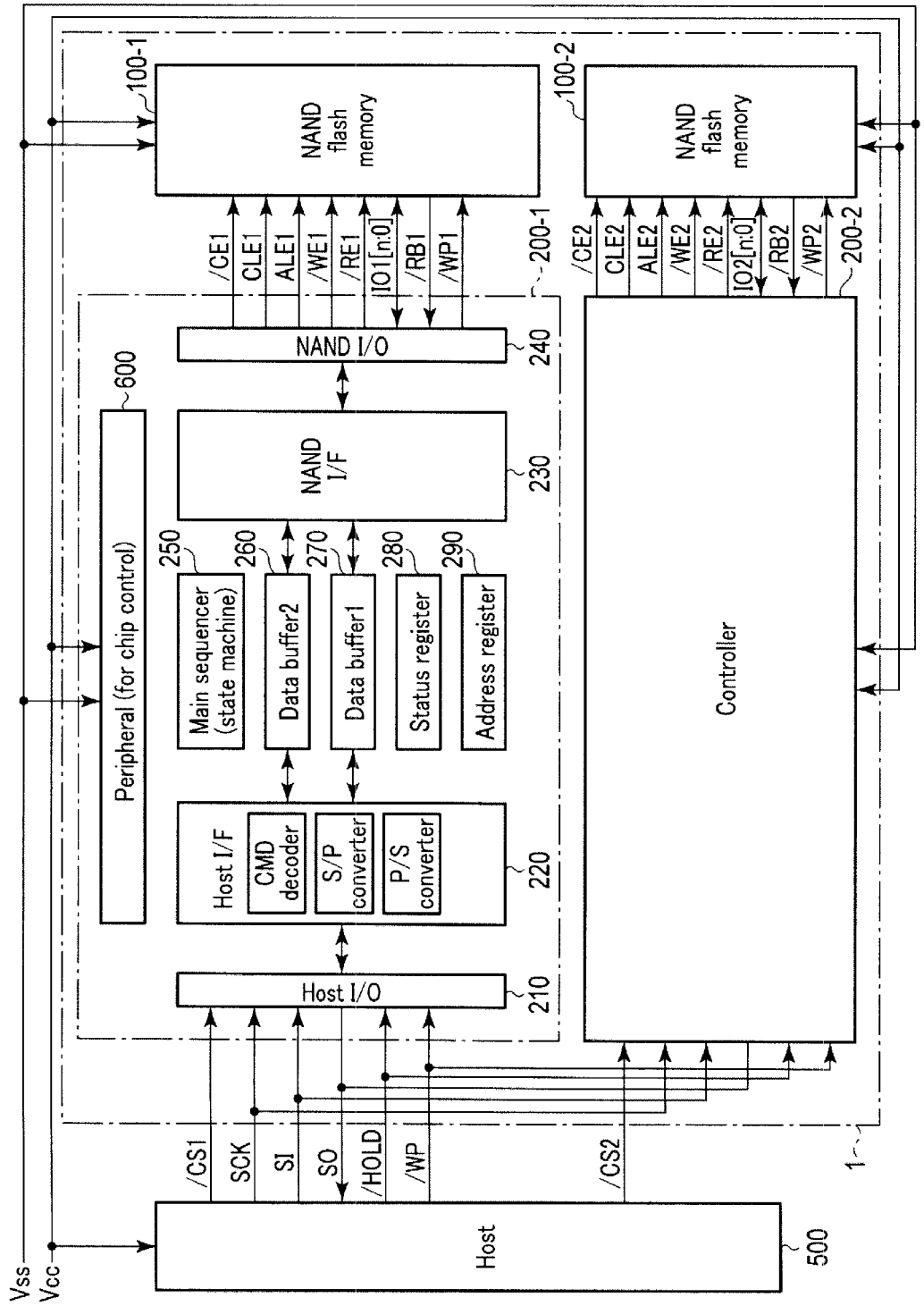
FIG. 4 is a block diagram of the memory system according to the first embodiment.

FIG. 4 is a functional block diagram illustrating an internal configuration of the memory system 1. In the following description, the memory chips 100-1 and 100-2 are referred to as "NAND-type flash memories 100-1 and 100-2", and are also referred to simply as a "NAND-type flash memory 100" when no distinction is required between the two. Moreover, the controller chips 200-1 and 200-2 are referred to as "controllers 200-1 and 200-2", and are also referred to simply as a "controller 200" when no distinction is required between the two.

As illustrated, the memory system 1 includes NAND-type flash memories 100-1 and 100-2 and controllers 200-1 and 200-2.

The NAND-type flash memories 100-1 and 100-2, each of which include a plurality of memory cells, can store data in a non-volatile manner. The controllers 200-1 and 200-2 are connected by NAND buses to the NAND-type flash memories 100-1 and 100-2, respectively, and are connected by SPI buses to a host device 500. Then, the controllers 200-1 and 200-2 control accesses to the NAND-type flash memories 100-1 and 100-2, respectively.

The NAND buses are used to send and receive signals conforming to the NAND interface. Specific examples of these signals include a chip enable signal /CE, an address latch enable signal ALE, a command latch enable signal CLE, a write enable signal /WE, a read enable signal /RE, a read/busy signal /RB, an input-output signal I/O, and a write protect signal /WP.

The signal /CE, which is a signal that is asserted at low level and is used to activate the NAND-type flash memory 100, is asserted at the time of access to the NAND-type flash memory 100. The signals CLE and ALE are signals used to notify the NAND-type flash memory 100 that the input signals I/O to the NAND-type flash memory 100 are a command and an address, respectively. The signal /WE is a signal that is asserted at low level and is used to allow the input signal I/O to be input to the NAND-type flash memory 100. Moreover, the signal /RE is a signal that is asserted at low level and is used to read the output signal I/O from the NAND-type flash memory 100. The ready/busy signal /RB is a signal indicating whether the NAND-type flash memory 100 is in a ready state (a state in which it is able to receive a command from the controller 200) or in a busy state (a state in which it is not able to receive a command from the controller 200). The low level of the ready/busy signal /RB indicates the busy state. The input-output signal I/O is, for example, a signal with 8 bits (n=8). The input-output signal I/O is an entity of data that is sent and received between the NAND-type flash memory 100 and the controller 200, including, for example, a command, an address, write data, and read data. The signal /WP is a signal used to inhibit writing to the NAND-type flash memory 100.

Furthermore, in the following description, where necessary, a suffix of "1" is appended to the names of the signals on the NAND buses between the NAND-type flash memory 100-1 and the controller 200-1, and a suffix of "2" is appended to the names of the signals on the NAND buses between the NAND-type flash memory 100-2 and the controller 200-2. More specifically, the respective signals on the NAND buses between the NAND-type flash memory 100-1 and the controller 200-1 are signals /CE1, CLE1, ALE1, /WE1, /RE1, IO1, /RB1, and /WP1, and the respective signals on the NAND buses between the NAND-type flash memory 100-2 and the controller 200-2 are signals /CE2 CLE2, ALE2, /WE2, /RE2, 102, /RB2, and /WP2.

The SPI buses are as described with reference to FIG. 3.

1.1.2 Configuration of the Controller 200

Next, details of a configuration of the controller 200 are described also with reference to FIG. 4. As illustrated, the controller 200 includes a host input-output circuit 210, a host interface circuit 220, a NAND interface circuit 230, a NAND input-output circuit 240, a sequencer (state machine) 250, data buffers 260 and 270, a status register 280, an address register 290, and a peripheral circuit 600.

The host input-output circuit 210 functions as a buffer for signals that are sent and received between the controller 200 and the host device 500. The signals SCK, SI, /CSI, /CS2, /HOLD, and /WP are first received by the host input-output circuit 210, and are then output therefrom to the host interface circuit 220. Furthermore, as described with reference to FIG. 3, the first pin, the second pin, the eighth pin to the tenth pin, the fifteenth pin, and the sixteenth pin are used in common by the controllers 200-1 and 200-2. Accordingly, the signals SCK, SI, /HOLD, and /WP output from the host device 500 are supplied to the host input-output circuits 210 of the controllers 200-1 and 200-2. Moreover, the signals SO output from the controllers 200-1 and 200-2 are output to the host device 500 via the same pin. However, individual pins for the chip select signals /CS are provided for the respective controllers 200-1 and 200-2. Then, the chip select signal /CS1 is supplied to the host input-output circuit 210 of the controller 200-1 via the seventh pin, and the chip select signal /CS2 is supplied to the host input-output circuit 210 of the controller 200-2 via the eleventh pin.

The host interface circuit 220 loads the signal SI thereinto in synchronization with the signal SCK while the corresponding chip select signal /CS is asserted. Moreover, the host interface circuit 220 transmits, to the host device 500 via the host input-output circuits 210, the signal SO, which is output in synchronization with the signal SCK while the corresponding chip select signal /CS is asserted.

The host interface circuit 220 performs control over sending and receiving of signals between the controller 200 and the host device 500 via the host input-output circuits 210. Furthermore, the host interface circuit 220 functions as a serial-parallel converter and a parallel-serial converter. For example, the host interface circuit 220 converts the input signal SI, received from the host device 500, from a serial signal to a parallel signal, and converts data, read from the NAND-type flash memory 100, from a parallel signal to a serial signal. Moreover, the host interface circuit 220 functions as a command decoder when the input signal SI is a command, thus decoding the received command. Then, the host interface circuit 220 outputs the result of decoding the command signal to, for example, the sequencer 250.

The data buffer 260 or 270 temporarily holds write data, received from the host device 500 via the host interface circuit 220. Moreover, the data buffer 260 or 270 temporarily holds data, read from the NAND-type flash memory 100 via the NAND interface circuit 230.

The status register 280 holds various pieces of status information on the corresponding controller 200 and NAND-type flash memory 100. More specifically, the status register 280 of the controller 200-1 holds information on a status of the controller 200-1 and a status of the NAND-type flash memory 100-1, and the status register 280 of the controller 200-2 holds information on a status of the controller 200-2 and a status of the NAND-type flash memory 100-2.

The address register 290 holds an address, received from the host device 500, via the host interface circuit 220.

The NAND interface circuit 230 performs control over sending and receiving of signals between the controller 200 and the NAND-type flash memory 100 via the NAND input-output circuit 240. Then, the NAND interface circuit 230 issues various commands conforming to the NAND interface according to instructions from the sequencer 250, and outputs the commands, together with the corresponding address held in the address register 290, to the NAND-type flash memory 100 via the NAND input-output circuit 240. During the writing of data into the NAND-type flash memory 100, the NAND interface circuit 230 outputs data held in the data buffer 260, the data buffer 270, or both to the NAND-type flash memory 100 via the NAND input-output circuit 240. Furthermore, during the reading of data from the NAND-type flash memory 100, the NAND interface circuit 230 transfers data, read from the NAND-type flash memory 100, to the data buffer 260, the data buffer 270, or both.

The NAND input-output circuit 240 functions as a buffer for signals that are sent and received between the controller 200 and the NAND-type flash memory 100. Furthermore, the NAND input-output circuit 240 asserts or deasserts the signals /CE, CLE, ALE, /WE, /RE, and /WP according to instructions from the NAND interface circuit 230. Moreover, during reading of data, the NAND input-output circuit 240 temporarily holds the signal IO (read data) and then transfers the signal IO to the NAND interface circuit 230, and, during writing of data, the NAND input-output circuit 240 temporarily holds the signal IO (write data) and then transfers the signal IO to the NAND-type flash memory 100. Additionally, the NAND input-output circuit 240 receives the ready/busy signal /RB from the NAND-type flash memory 100 and then transfers it to the NAND interface circuit 230.

The sequencer 250 controls operations of the entire controller 200. For example, in response to receipt of a read request for data from the host device 500, the sequencer 250 instructs the NAND interface circuit 230 to execute a sequence for performing a read operation. Furthermore, in response to receipt of a write request for data from the host device 500, the sequencer 250 instructs the NAND interface circuit 230 to execute a sequence for performing a write operation. Moreover, the sequencer 250 updates the status information held in the status register 280 according to information received from the NAND-type flash memory 100.

The peripheral circuit 600 receives the power-supply voltage Vcc from the outside and then transfers the voltage Vcc to each circuit block, and performs other control operations required for the operation of the controller 200.

1.1.3 Configuration of the NAND-type Flash Memory 100

Figure 5:
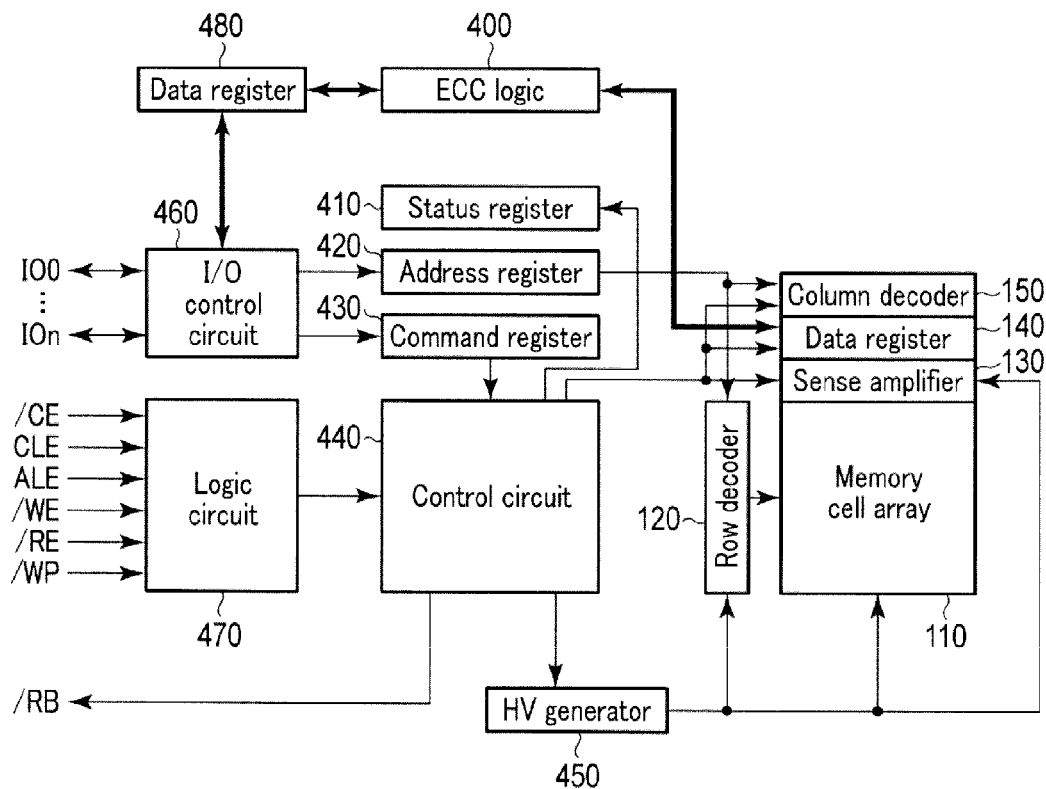
FIG. 5 is a block diagram of a semiconductor memory device according to the first embodiment.

Next, a configuration of the NAND-type flash memory 100 is described with reference to FIG. 5. FIG. 5 is a block diagram of the NAND-type flash memory 100.

As illustrated, the NAND-type flash memory 100 includes a memory cell array 110, a row decoder 120, a sense amplifier 130, a data register 140, a column decoder 150, an ECC circuit 400, a status register 410, an address register 420, a command register 430, a control circuit 440, a voltage generation circuit 450, an input-output control circuit 460, a logic circuit 470, and a data register 480.

The memory cell array 110 includes a plurality of non-volatile memory cells associated as rows and columns. The memory cells located in the same row are connected to the same word line, and the memory cells located in the same column are connected to the same bit line. Reading and writing of data are collectively performed on a plurality of memory cells connected to the same word line. This unit is referred to as a "page". Data for one page contains net data and management data. The net data is managed in a unit called "sector". For example, in this example, one page includes four sectors, and each sector has a data size of 512 bytes. The management data includes, for example, ECC data (parity) for error correction. Error correction is performed for each sector. Accordingly, the management data includes ECC data provided for each sector. Moreover, erasure of data is collectively performed in units of a plurality of pages. This unit is referred to as a "block".

The row decoder 120 decodes a row address that specifies a row direction of the memory cell array 110. Then, the row decoder 120 selects a word line according to a result of decoding, and applies voltages required for writing, reading, and erasure of data to the selected word line.

During reading of data, the sense amplifier 130 senses data read from the memory cell array 110 and then transfers the data to the data register 140. During writing of data, the sense amplifier 130 transfers data held in the data register 140 to the memory cell array 110.

The data register 140 temporarily holds write data or read data for one page.

The column decoder 150 decodes a column address that specifies a column direction of the memory cell array 110. Then, according to a result of decoding, the column decoder 150 transfers data to the data register 140 during writing and reads data from the data register 140 during reading.

The ECC circuit 400 performs error detection and error correction processing. More specifically, during writing of data, the ECC circuit 400 generates a parity for each sector based on data received from the controller 200 and then transfers the generated parity and the net data to the data register 140. During reading of data, the ECC circuit 400 generates a syndrome for each sector based on a parity included in the data transferred from the data register 140, thus detecting the presence of absence of any error. When an error is detected, the ECC circuit 400 identifies the bit position of the error and corrects the error. The number of error bits that are correctable for one sector is, for example in this case, 8 bits per sector. Furthermore, the ECC circuit 400 can output the number of error bits detected in each sector as status information to the status register 410.

The logic circuit 470 receives the signals /CE, CLE, ALE, /WE, /RE, and /WP from the controller 200.

The input-output control circuit 460 receives a signal IO [n:0]. Then, when the signal IO is an address (in the case of ALE="H"), the input-output control circuit 460 causes the address register 420 to hold the address. Moreover, when the signal IO is a command (in the case of CLE="H"), the input-output control circuit 460 causes the command register 430 to hold the command. Furthermore, when the signal IO is data (in the case of ALE=CLE="L"), the input-output control circuit 460 causes the data register 480 to hold the data.

The data register 480 temporarily holds data in between the ECC circuit 400 and the input-output control circuit 460.

The status register 410 holds various pieces of status information on the NAND-type flash memory 100. The status information includes, for example, the above-mentioned number of error bits, which is supplied from the ECC circuit 400, and information indicating whether a write operation and an erasure operation are successful (has passed) or unsuccessful (has failed), which is supplied from the control circuit 440.

The control circuit 440 controls the entire NAND-type flash memory 100 based on commands held in the command register 430 and various signals input to the logic circuit 470. More specifically, the control circuit 440 is in an operating state when the corresponding chip enable signal /CE is asserted, and is in a non-operating state when the signal /CE is deasserted. Furthermore, the control circuit 440 generates a ready/busy signal /RB and outputs the signal /RB to the controller 200.

The voltage generation circuit 450 generates voltages required for write, read, and erasure operations for data based on instructions from the control circuit 440 and supplies the generated voltages to the memory cell array 110, the row decoder 120, and the sense amplifier 130.

1.2 Operation

Figure 6:
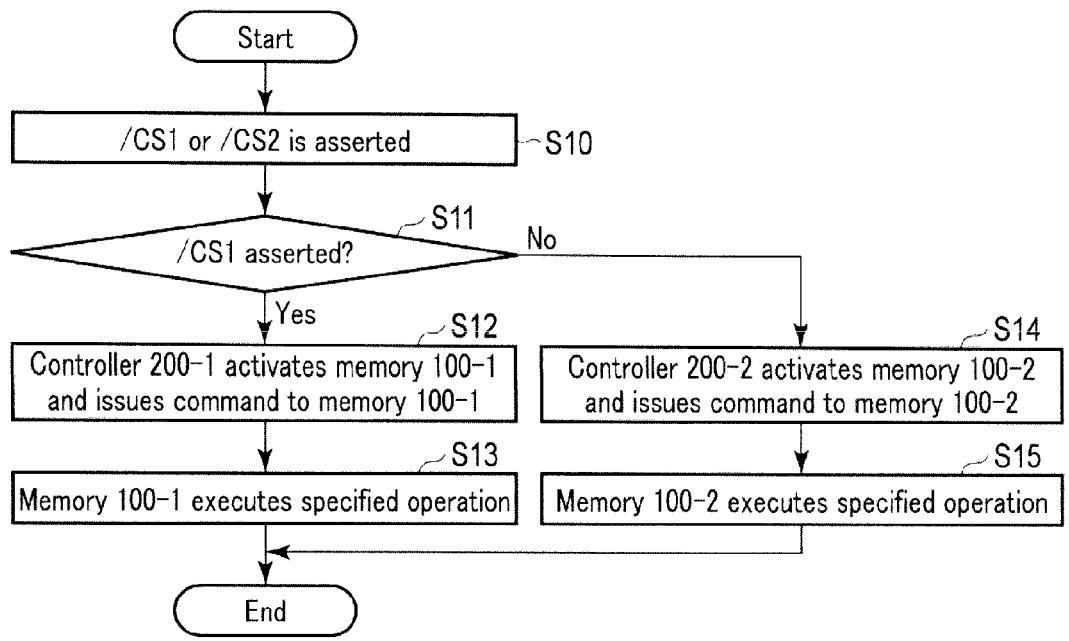
FIG. 6 is a flowchart illustrating an operation of the memory system according to the first embodiment.

Next, operation of the memory system 1 according to the present embodiment is described. First, selection between one of the pair of the NAND-type flash memory 100-1 and the controller 200-1 and the pair of the NAND-type flash memory 100-2 and the controller 200-2 is described with reference to FIG. 6. FIG. 6 is a flowchart illustrating an operation of the memory system 1.

As illustrated, first, in step S10, the chip select signal /CS1 or /CS2 is asserted by the host device 500. When the signal /CS1 is asserted (YES in step S11), then in step S12, the controller 200-1, which has received the signal /CS1, activates the NAND-type flash memory 100-1 (/CE1="L") and issues a command to the NAND-type flash memory 100-1 according to an instruction from the host device 500. Then, in step S13, the NAND-type flash memory 100-1 executes a specified operation according to the received command. When the signal /CS1 is asserted, basically, the signal /CS2 is deasserted. Accordingly, in a case where the NAND-type flash memory 100-1 is accessed by the host device 500, the NAND-type flash memory 100-2 is not accessed by the host device 500.

A similar operation applies to the opposite case. When the signal /CS2 is asserted (NO in step S11), then in step S14, the controller 200-2, which has received the signal /CS2, activates the NAND-type flash memory 100-2 (/CE2="L") and issues a command to the NAND-type flash memory 100-2 according to an instruction from the host device 500. Then, in step S15, the NAND-type flash memory 100-2 executes a specified operation according to the received command.

In the following description, with a case where the signal /CS1 is asserted taken as an example, read, write, and erasure operations for data are described with attention focused on signals that are sent and received via the SPI buses and NAND buses. The operating entity that performs the following operation is the NAND-type flash memory 100-1 and the controller 200-1 in the memory system 1. Furthermore, in a case where the signal /CS2 is asserted, the NAND-type flash memory 100-2 and the controller 200-2 act as the operating entity.

1.2.1 Read Operation

First, a read operation is described. The read operation broadly includes the following three steps:

(1) Reading of data from the NAND-type flash memory 100: This operation causes data to be read from the NAND-type flash memory 100 to the controller 200.

(2) Reading of a feature table (sometimes referred to as "Get feature"): The feature table refers to a table that is generated by, for example, the sequencer 250 and is held in the status register 280, and that holds various pieces of status information (for example, program failure, erasure failure, and ECC processing result). This operation enables determining whether the memory system 1 is in a busy state or in a ready state, in other words, whether the operation (1) has been completed.

(3) Reading of data from the controller 200: This operation causes data read to the controller 200 from the NAND-type flash memory 100 in the operation (1) to be read to the host device 500.

Figure 7:
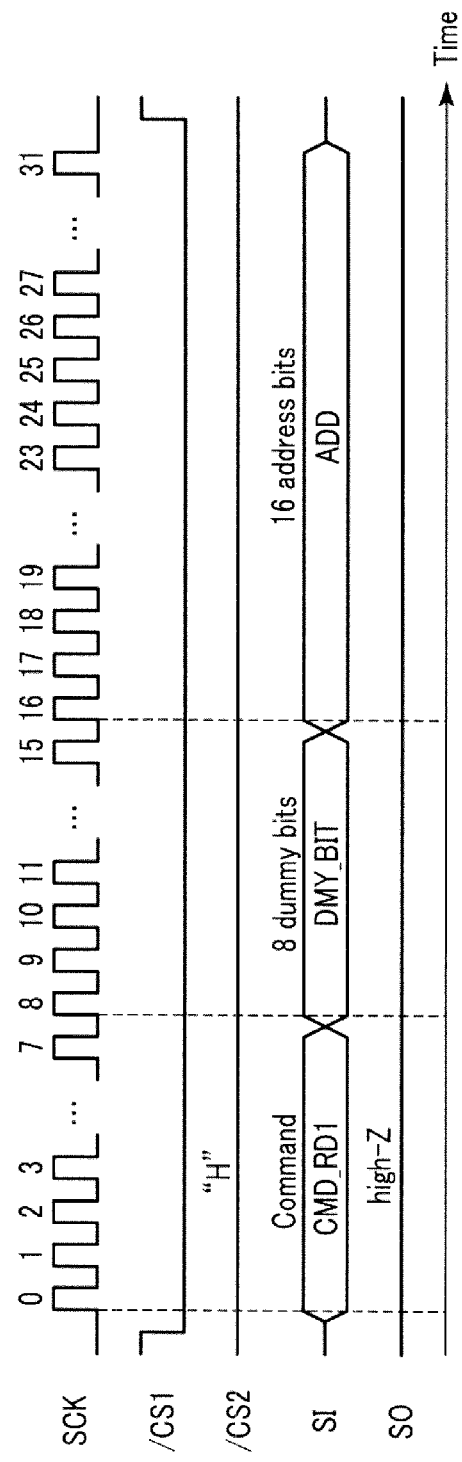
FIG. 7 is a timing chart of various signals during a read operation of the memory system according to the first embodiment.

FIG. 7 is a timing chart of various signals on the SPI buses during execution of the above-mentioned operation (1). As illustrated, the host device 500 asserts the signal /CS1, deasserts the signal /CS2, issues a first read command CMD_RD1 as the signal SI, and further monitors the clock SCK signal.

The host interface circuit 220 of the controller 200-1 recognizes, as a command, the signal SI received when the first clock SCK signal has been received after the signal /CS1 is asserted. This command (SI signal) is, for example, an 8-bit signal that is input over eight clock cycles. In response to receipt of the first read command CMD_RD1, the sequencer 250 starts a data read sequence.

Subsequently, the host device 500 sends dummy bits DMY_BIT to the controller 200, for example, over eight clock cycles, and, after that, sends an address ADD to the controller 200, for example, over sixteen cycles. Then, after sending the address ADD, the host device 500 deasserts the signal /CS1. The address ADD is an address that specifies a block and a page in the NAND-type flash memory 100-1, and is held in the address register 290.

In this way, it is previously determined what signal is input after a specific command is received (a command sequence). In other words, for example, when having received the first read command, the controller 200 recognizes that the signal SI input for eight clock cycles after that command is meaningless dummy data and that the signal SI input for sixteen clock cycles after that data is a substantive address signal.

Figure 8:
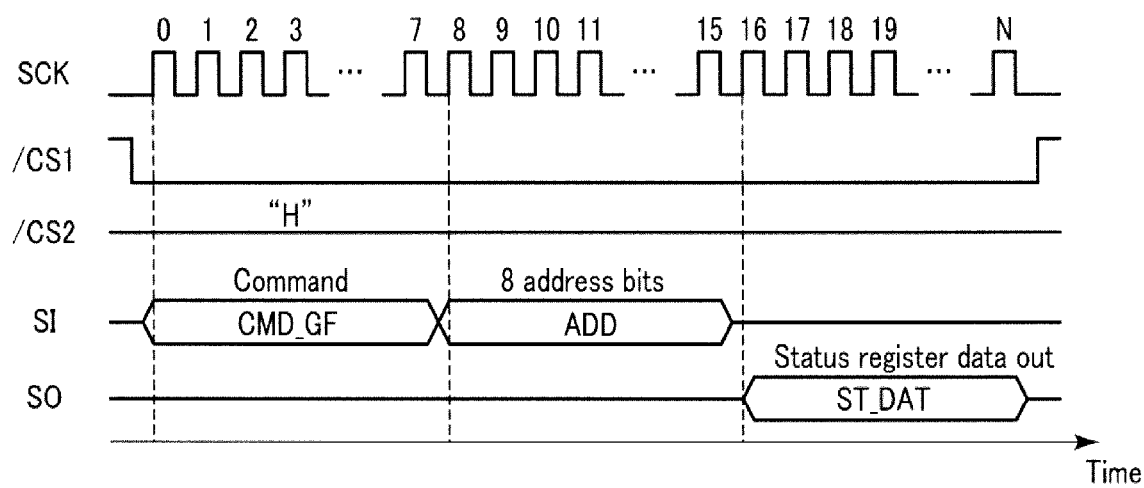
FIG. 8 is a timing chart of various signals during a read operation of the memory system according to the first embodiment.

The operation (2) is performed subsequent to the above-mentioned operation (1). FIG. 8 is a timing chart of various signals on the SPI buses during execution of the operation (2). As illustrated, the host device 500 asserts the signal /CS1 again, issues a Get feature command CMD_GF as the signal SI, and further transmits the clock SCK. The signal /CS2 remains deasserted.

Subsequently, the host device 500 sends an address ADD to the controller 200, for example, over eight clock cycles. This address ADD is an address in the feature table, and the address specifies a region in which ready/busy information on the controller 200-1 and on the NAND-type flash memory 100-1 is stored. In the controller 200-1, after receiving the address ADD, the host interface circuit 220 reads a specified entry in the feature table from the status register 280, for example, according to an instruction from the sequencer 250, and sends, to the host device 500, the specified entry as 8-bit status data ST_DAT over eight cycles. The status data ST_DAT includes the ready/busy information. Then, after receiving the status data ST_DAT, the host device 500 deasserts the signal /CS1.

Figure 9:
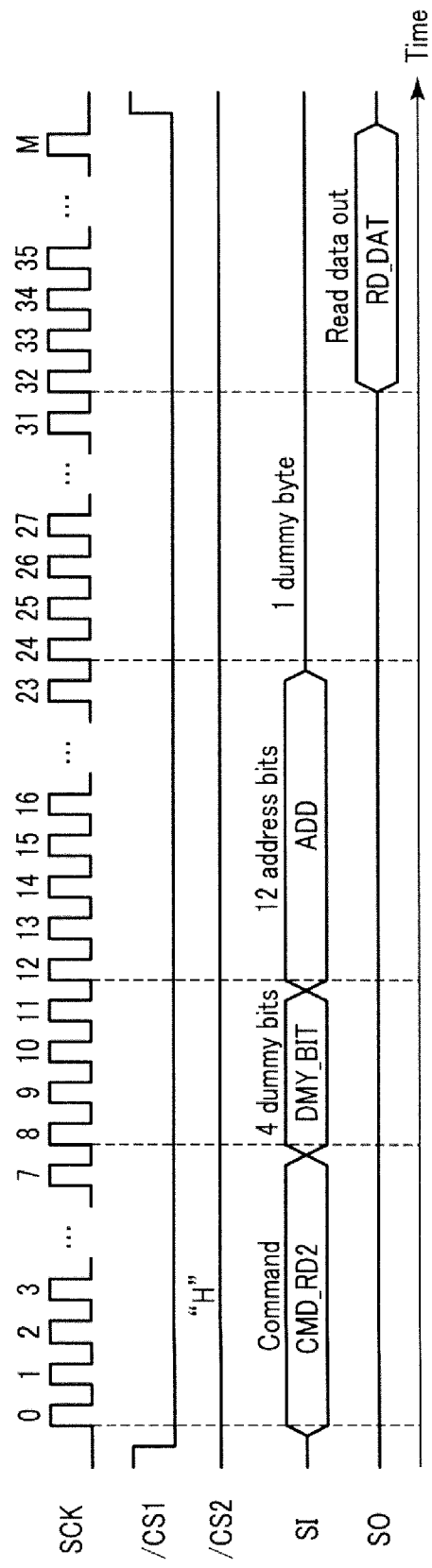
FIG. 9 is a timing chart of various signals during a read operation of the memory system according to the first embodiment.

When the received status data ST_DAT indicates that the memory system 1 (the controller 200-1 and the NAND-type flash memory 100-1) is in a ready state, operation (3) is performed. FIG. 9 is a timing chart of various signals on the SPI buses during execution of the operation (3). As illustrated, the host device 500 asserts the signal /CS1, issues a second read command CMD_RD2 as the signal SI, and further transmits the clock SCK. The signal /CS2 remains deasserted.

Subsequently, the host device 500 sends dummy bits DMY_BIT to the controller 200, for example, over four clock cycles, and, after that, sends an address ADD to the controller 200, for example, over twelve clock cycles. The address ADD is used to specify a region in the data buffer 260 or 270 included in the controller 200-1, and it specifies a column in a page in the NAND-type flash memory 100-1. The address ADD is held in the address register 290. Then, the host interface circuit 220 reads data from the data buffer 260 or 270, for example, according to a control operation of the sequencer 250. Then, after the elapse of eight clock cycles, the host interface circuit 220 sends, to the host device 500, the data RD_DAT read from the data buffer 260 or 270.

Figure 10:
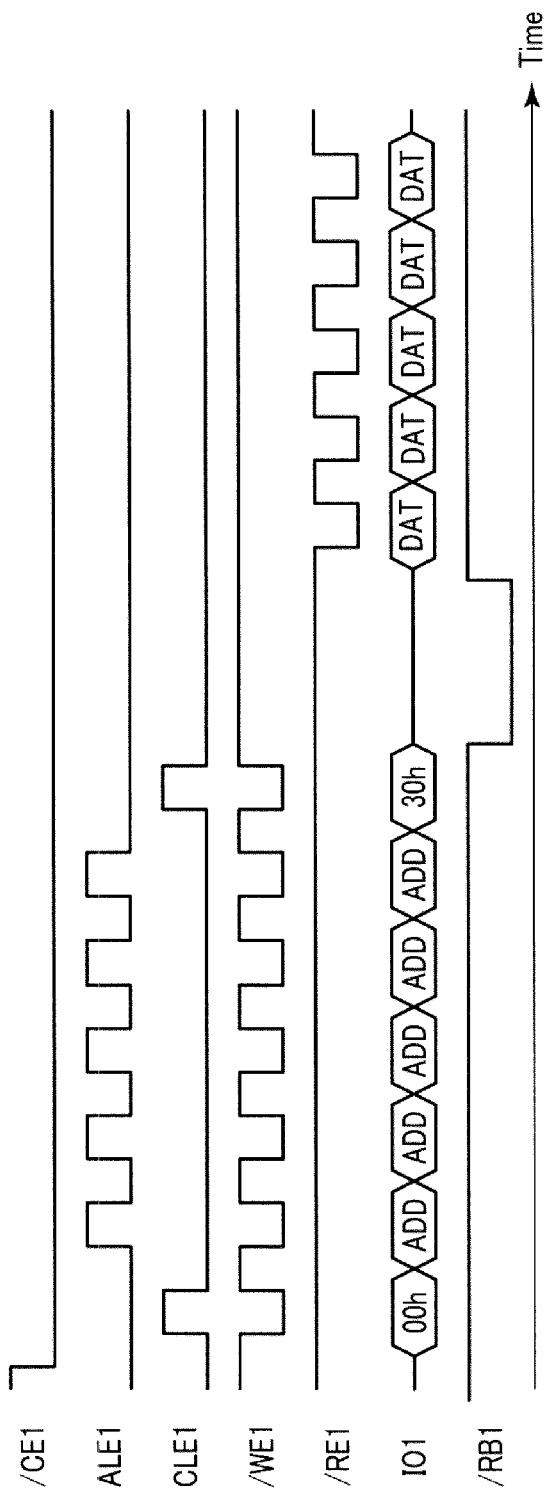
FIG. 10 is a timing chart of various signals during a read operation of the memory system according to the first embodiment.
Figure 11:
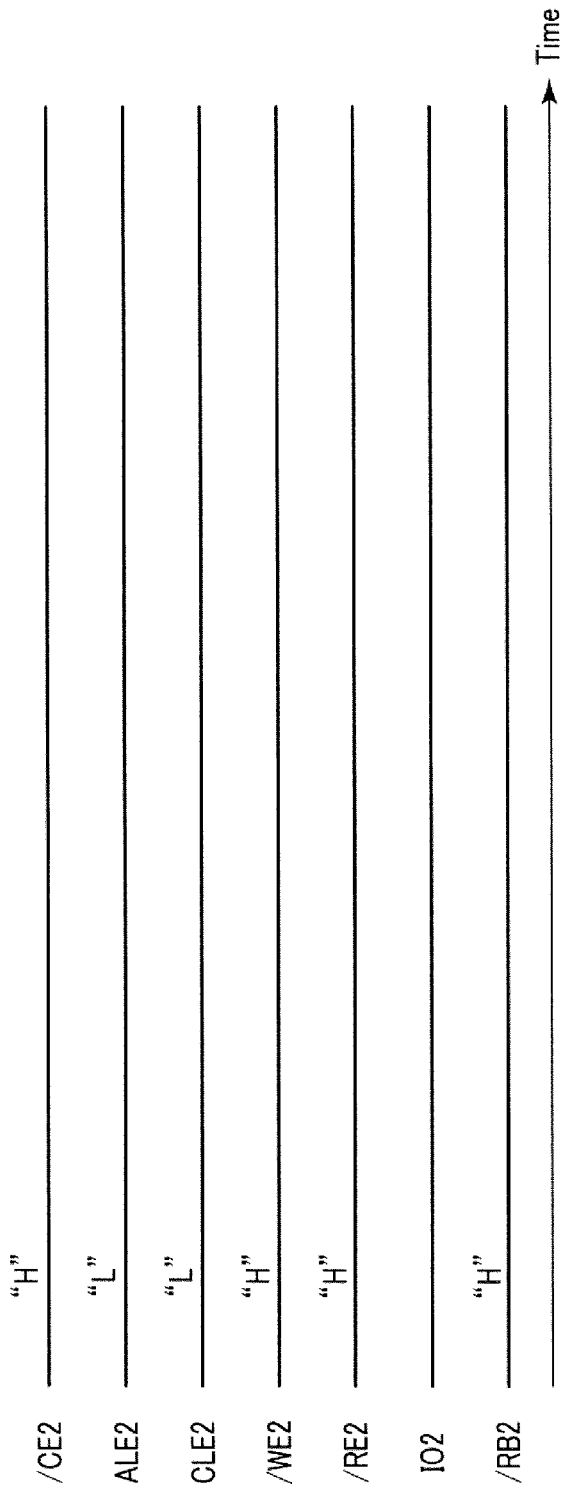
FIG. 11 is a timing chart of various signals during a read operation of the memory system according to the first embodiment.

FIG. 10 and FIG. 11 are timing charts of various signals on the NAND buses during the above-mentioned operation (1), FIG. 10 illustrating signals that are sent and received between the controller 200-1 and the NAND-type flash memory 100-1 and FIG. 11 illustrating signals that are sent and received between the controller 200-2 and the NAND-type flash memory 100-2.

First, the controller 200-1 and the NAND-type flash memory 100-1 are described with reference to FIG. 10. As illustrated, in the controller 200-1, which has received the first read command CMD_RD1, for example, the NAND interface circuit 230 asserts the signal /CE1 (to the "L" level), issues an address input command "00h", and sends the command "00h" to the NAND-type flash memory 100-1, according to a control operation of the sequencer 250. Subsequently, the NAND interface circuit 230 sends an address ADD to the NAND-type flash memory 100-1, for example, over five cycles, and, after that, issues a read command "30h" and sends the command "30h" to the NAND-type flash memory 100-1. Furthermore, this address ADD includes an address indicating a block, a page, and a column that are held in the address register 290 in the operations illustrated in FIG. 7 and FIG. 9.

In the NAND-type flash memory 100-1, which has been activated by the signal /CE1 being asserted, a read operation for data from the memory cell array 110 is started in response to the command "30h", so that the NAND-type flash memory 100-1 enters a busy state (/RB1="L").

Upon completion of reading of data from the memory cell array 110, the NAND-type flash memory 100-1 enters a ready state. In response to this, the controller 200-1 toggles (twice switches) the signal /RE1. Then, data is transferred from the NAND-type flash memory 100-1 to the controller 200-1 in synchronization with the signal /RE1.

Next, the controller 200-2 and the NAND-type flash memory 100-2 are described with reference to FIG. 11. Since the signal /CS2 is deasserted, the controller 200-2 does not load the signal SI supplied from the fifteenth pin into the inside thereof, or, even when loading the signal SI into the inside thereof, determines that the signal SI is not directed to the controller 200-2. Accordingly, the controller 200-2 sets the signal /CE2 to the "H" level. As a result, the NAND-type flash memory 100-2 is inactivated. Then, the controller 200-2 deasserts the signals ALE2 and CLE2 (to the "L" level), and further deasserts the signals /WE2 and /RE2 (to the "H" level). Accordingly, no data is read from the NAND-type flash memory 100-2.

Furthermore, when data is read from the NAND-type flash memory 100-2, the host device 500 asserts the signal /CS2 and deasserts the signal /CS1. Then, the signal SI is received by the controller 200-2, so that the NAND-type flash memory 100-2 operates in a manner similar to that described with reference to FIG. 10.

Figure 12:
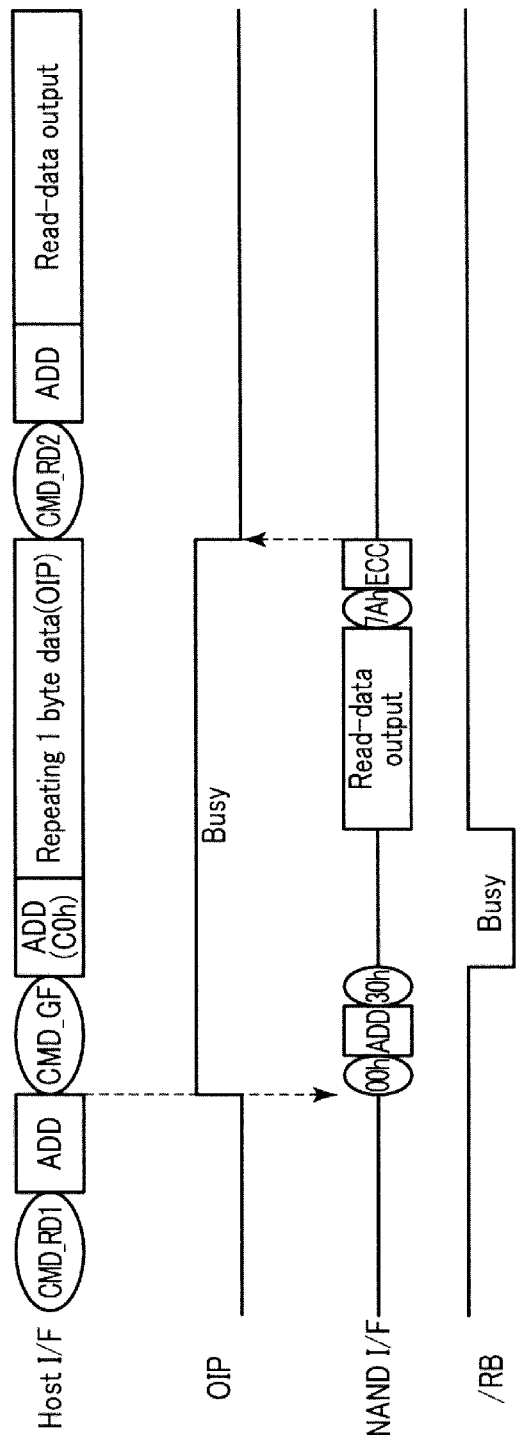
FIG. 12 illustrates a command sequence during a read operation of the memory system according to the first embodiment.

FIG. 12 illustrates a command sequence executed when data is read from the NAND-type flash memory 100-1.

As illustrated, first, the host device 500 issues a first read command CMD_RD1 and then issues an address ADD. In response to the address ADD, the memory system 1 (the controller 200-1 and the NAND-type flash memory 100-1) enters a busy state, and a flag OIP in the feature table held in the controller 200-1 is set to "1". Moreover, the host device 500 issues a Get feature command CMD_GF and an address ADD (="C0h"), and reads information (1-byte data) on an entry including the flag OIP from the feature table. The address "C0h" specifies an entry address including the flag OIP. Then, this entry information is repeatedly sent to the host device 500 until the flag OIP becomes "0". Moreover, the Get feature command can be repeatedly issued.

Along with the memory system 1 entering a busy state, the controller 200-1 issues a command "00h", an address ADD, and a command "30h" to the NAND-type flash memory 100-1. This brings the NAND-type flash memory 100-1 into a busy state. Then, data is read from the memory cell array 110. Subsequently, the ECC circuit 400 performs error detection on the read data, and, when detecting an error, corrects the error.

After that, the NAND-type flash memory 100-1 enters a ready state, so that read data is sent to the controller 200-1. Subsequently, the controller 200-1 issues an ECC status read command "7Ah". Then, in response to this command, the NAND-type flash memory 100-1 outputs the number of error bits for each sector, which has been detected in the ECC processing, to the controller 200-1.

When the number of error bits is transferred from the NAND-type flash memory 100-1 to the controller 200-1, the memory system 1 enters a ready state, so that, for example, the sequencer 250 sets the flag OIP in the feature table from "1" to "0".

In response to the flag OIP becoming "0", the host device 500 issues a second read command CMD_RD2, and reads, from the controller 200-1, the read data error-corrected by the ECC circuit 400.

1.2.2 Write Operation

Next, a write operation is described. The write operation broadly includes the following three steps:

(1)' Data transfer from the host device 500 to the controller 200.

(2)' Writing of the transferred data to the NAND-type flash memory 100.

(3)' Reading of a feature table (Get feature): This operation enables determining whether writing to the NAND-type flash memory 100 has passed or failed.

Figure 13:
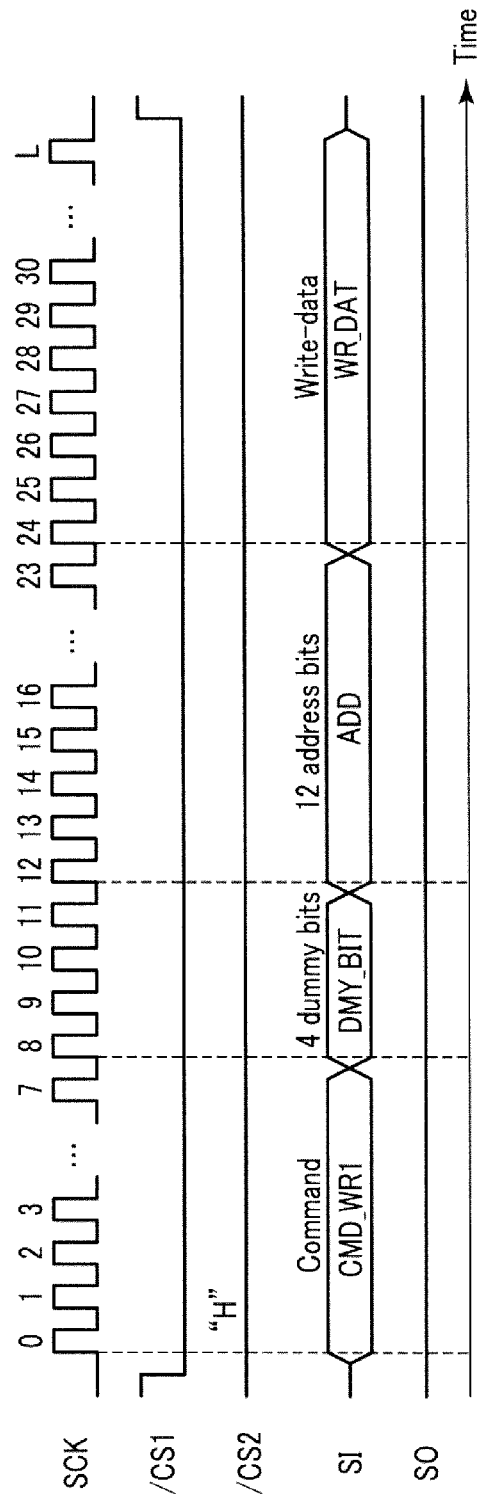
FIG. 13 is a timing chart of various signals during a write operation of the memory system according to the first embodiment.

FIG. 13 is a timing chart of various signals on the SPI buses during execution of the operation (1)'. As illustrated, the host device 500 asserts the signal /CS1, deasserts the signal /CS2, issues a first write command CMD_WR1 as the signal SI, and further transmits the clock signal SCK. In response to receipt of the first write command CMD_WR1, the sequencer 250 of the controller 200-1 starts a data write sequence.

Subsequently, the host device 500 sends dummy bits DMY_BIT to the controller 200, for example, over four clock cycles. After that, the host device 500 sends an address ADD to the controller 200, for example, over twelve cycles. This address ADD specifies a region in the data buffer 260 or 270, and specifies a column in a page in the NAD-type flash memory 100-1. The address ADD is held in the address register 290. Then, the host device 500 sends write data WR_DAT to the controller 200. This write data WR_DAT is held in a region corresponding to the address ADD which address ADD was received immediately before in the data buffer 260 or 270. Then, after sending the data WR_DAT, the host device 500 deasserts the signal /CS1.

Figure 14:
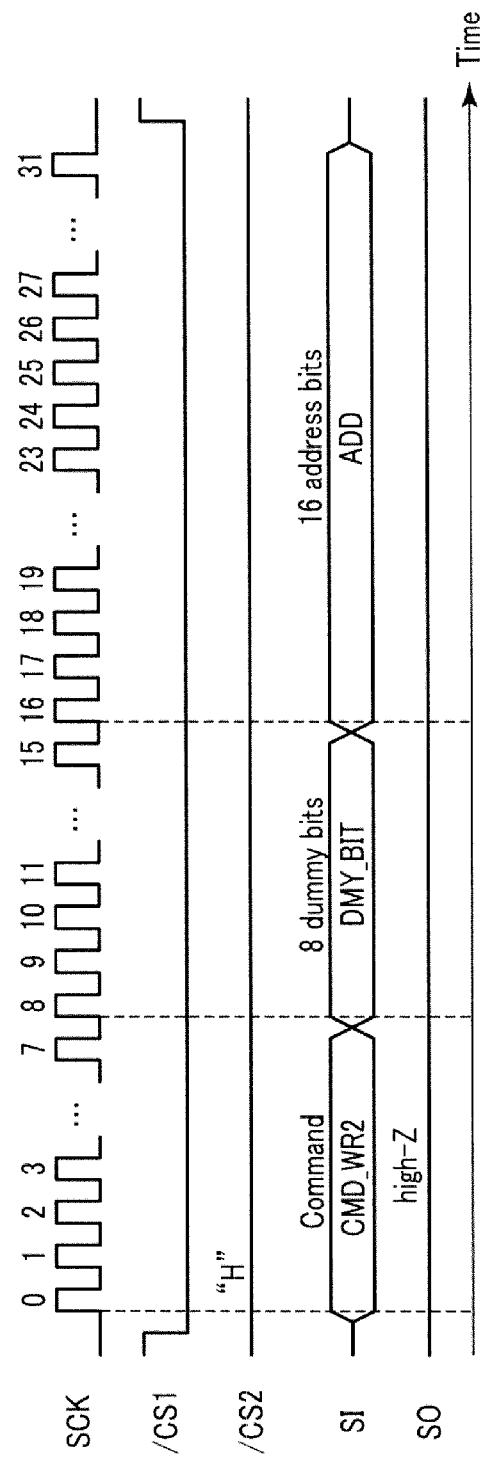
FIG. 14 is a timing chart of various signals during a write operation of the memory system according to the first embodiment.

The operation (2)' (Writing of the transferred data to the NAND-type flash memory 100) is performed subsequent to the operation (1)' (Data transfer from the host device 500 to the controller 200). FIG. 14 is a timing chart of various signals on the SPI buses during execution of the operation (2)'. As illustrated, the host device 500 asserts the signal /CS1 again, issues a second write command CMD_WR2 as the signal SI, and further transmits the clock signal SCK. The signal /CS2 remains deasserted. The sequencer 250 of the controller 200-1, which has received the second write command CMD_WR2, recognizes having received an instruction for the operation (2)'.

Subsequently, the host device 500 sends 8-bits of dummy bits DMY_BIT to the controller 200, for example, over eight clock cycles, and, after that, sends a 16-bit address ADD to the controller 200, for example, over sixteen cycles. This address ADD specifies a block and a page in the NAND-type flash memory 100-1, and is held in the address register 290 of the controller 200-1. Then, after sending the address ADD, the host device 500 deasserts the signal /CS1.

Subsequent to the operation (2)' (Data transfer from the host device 500 to the controller 200), the operation (3)' (Reading of the feature table) is performed. A command sequence in this operation is similar to that illustrated in FIG. 8, which has been described with regard to the read operation. Furthermore, when information indicating that the memory system 1 is in a ready state is included in the received status data ST_DAT, the host device 500 then requests information on whether writing of data has failed.

Figure 15:
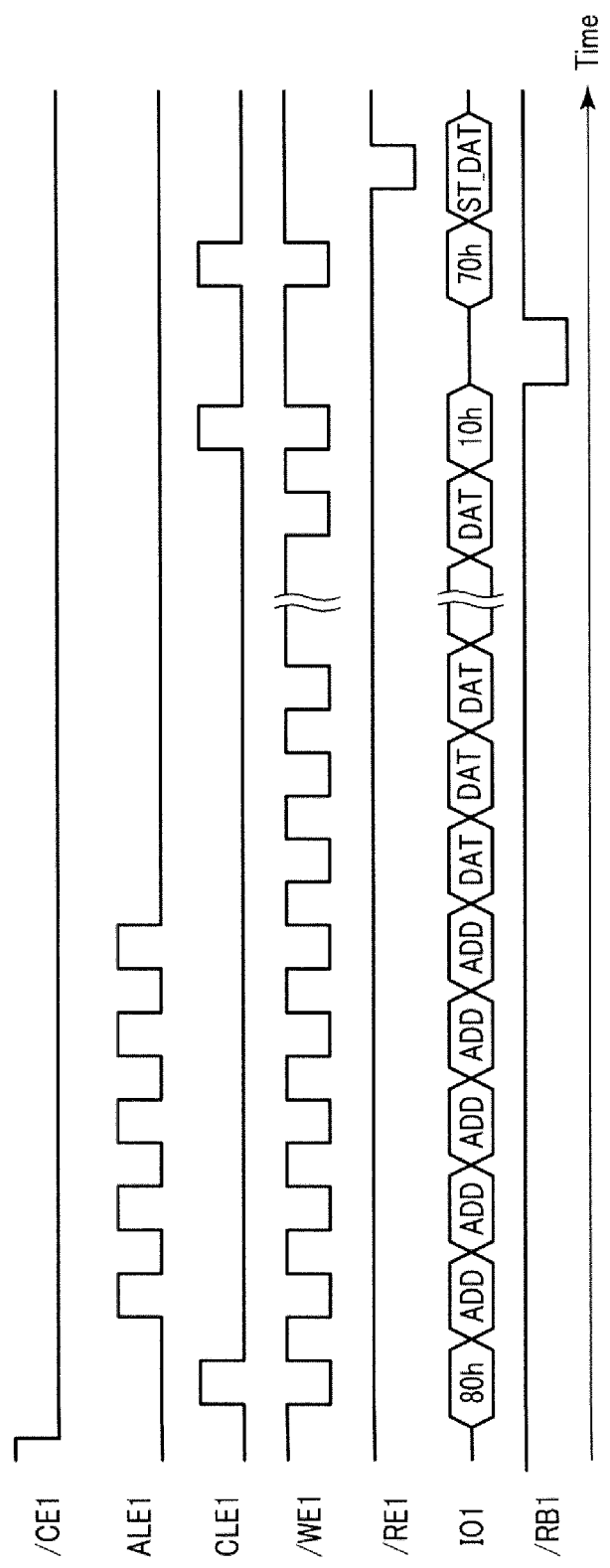
FIG. 15 is a timing chart of various signals during a write operation of the memory system according to the first embodiment.

FIG. 15 is a timing chart of various signals on the NAND buses between the controller 200-1 and the NAND-type flash memory 100-1 during the above-mentioned operation (2)'. In the controller 200-1, which has received the second write command CMD_WR2, for example, the NAND interface circuit 230 issues a write command "80h" and sends the command "80h" to the NAND-type flash memory 100-1, according to a control operation of the sequencer 250. Subsequently, the NAND interface circuit 230 sends an address ADD to the NAND-type flash memory 100-1 over, for example, five clock cycles, and then, write data DAT is sent to the NAND-type flash memory 100-1 over a plurality of cycles. After that, the NAND interface circuit 230 issues a write command "10h" and sends the command "10h" to the NAND-type flash memory 100-1. Furthermore, the address ADD includes an address indicating a block, a page, and a column that are held in the address register 290 in the operations illustrated in FIG. 13 and FIG. 14.

In response to the command "10h", a write operation for data to the memory cell array 110 is started in the NAND-type flash memory 100-1, so that the NAND-type flash memory 100-1 enters a busy state (/RB1="L").

When writing of data to the memory cell array 110 is completed, the NAND-type flash memory 100-1 enters a ready state. In response to this, the controller 200-1 issues a status read command "70h" and toggles (twice switches) the signal /RE1. Then, status data ST_DAT indicating whether the write operation has passed or failed is transferred to the controller 200-1 in synchronization with the signal /RE1. The status data ST_DAT is held in the feature table, and is read to the host device 500 in response to the Get feature command in the above-mentioned operation (3)'.

Signals on the NAND buses between the controller 200-2 and the NAND-type flash memory 100-2 are as described with reference to FIG. 11.

1.2.3 Erasure Operation

Next, an erasure operation is described. The erasure operation includes the following two steps in a brief way.

(1)" An erasure instruction from the host device 500 to the controller 200.

(2)" Reading of the feature table (Get feature): This operation enables determining whether an erasure operation performed on the NAND-type flash memory 100 has passed or failed.

Figure 16:
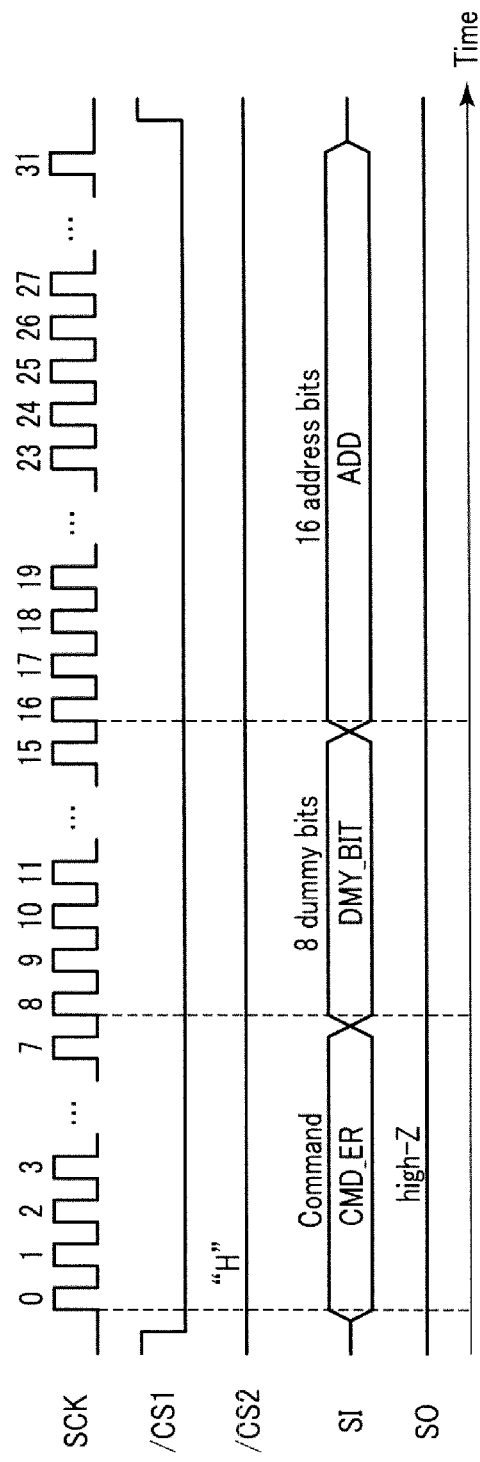
FIG. 16 is a timing chart of various signals during an erasure operation of the memory system according to the first embodiment.

FIG. 16 is a timing chart of various signals on the SPI buses during execution of the operation (1)". As illustrated, the host device 500 asserts the signal /CS1, deasserts the signal /CS2, issues an erasure command CMD_ER as the signal SI, and further issues the clock SCK. In response to receipt of the erasure command CMD_ER, the sequencer 250 of the controller 200-1 starts a data erasure sequence.

Subsequently, the host device 500 sends 8-bit dummy bits DMY_BIT to the controller 200, for example, over eight clock cycles. After that, the host device 500 sends a 16-bit address ADD to the controller 200, for example, over sixteen cycles. This address ADD is used to specify a block to be erased in the memory cell array 110 of the NAND-type flash memory 100-1, and is held in the address register 290 of the controller 200-1. After that, the host device 500 deasserts the signal /CS1.

Subsequent to the operation (1)", the operation (2)" (reading the feature table) is performed. A command sequence in this operation is similar to that illustrated in FIG. 8, which has been described with regard to the read operation. Furthermore, when information indicating that the memory system 1 is in a ready state is included in the received status data ST_DAT, the host device 500 then requests information on whether erasure of data has passed or failed.

Figure 17:
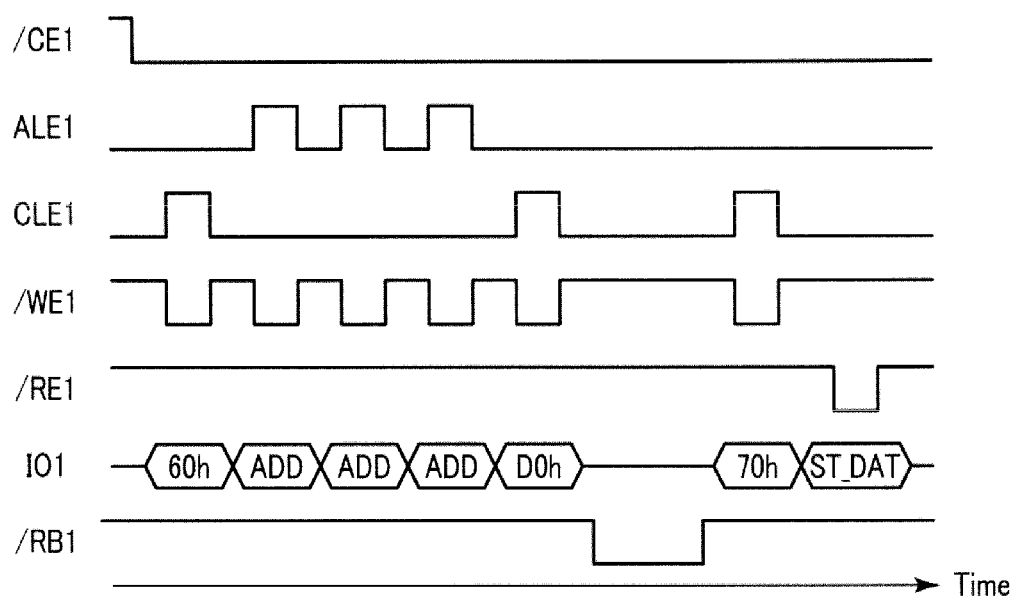
FIG. 17 is a timing chart of various signals during an erasure operation of the memory system according to the first embodiment.

FIG. 17 is a timing chart of various signals on the NAND buses between the controller 200-1 and the NAND-type flash memory 100-1 during the above-mentioned operation (1)". In the controller 200-1, which has received the erasure command CMD_ER, for example, the NAND interface circuit 230 issues an erasure command "60h" and sends the command "60h" to the NAND-type flash memory 100-1, according to a control operation of the sequencer 250. Subsequently, the NAND interface circuit 230 sends an address ADD to the NAND-type flash memory 100-1, for example, over three clock cycles, and, then, further issues an erasure command "D0h" and sends it to the NAND-type flash memory 100-1.

In response to the command "D0h", an erasure operation for data on the memory cell array 110 is started in the NAND-type flash memory 100-1, so that the NAND-type flash memory 100-1 enters a busy state (/RB1="L").

When erasure of data is completed, the NAND-type flash memory 100-1 enters a ready state. In response to this, the controller 200-1 issues a status read command "70h" and toggles (twice switches) the signal /RE1. Then, status data ST_DAT indicating whether the erasure operation has passed or failed is transferred to the controller 200-1 in synchronization with the signal /RE1. The status data ST_DAT is held in the feature table, and is read to the host device 500 in response to the Get feature command in the above-mentioned operation (2)".

1.3 Advantageous Effect in the Present Embodiment

According to the present embodiment, the memory capacity of a memory system can be readily increased. More specifically, in the case of the present embodiment, a plurality of chip select signals /CS is provided. Accordingly, merely adding a pair of a memory chip 100 and a controller chip 200 in a package enables readily increasing the memory capacity of the memory system 1. Then, asserting a corresponding chip select signal /CS enables accessing a freely-specified memory chip 100.

Furthermore, as described with reference to FIGS. 1 and 2, stacking a plurality of memory chips 100 in layers in a package enables minimizing an increase in size of the package. Moreover, in a case where only one chip select signal /CS can be provided, only one memory chip can be mounted in a package. Thus, the simplest method for doubling the memory capacity is using two packages. However, in this case, the area occupied by the two packages on a mounting substrate also doubles. In this respect, according to the present embodiment, since two memory chips are mounted while being stacked in layers in one package, the area occupied by the two packages on a mounting substrate is nearly unchanged, so that an efficient layout can be attained.

2. Second Embodiment

Next, a memory system according to a second embodiment is described. One controller 200 controls a plurality of NAND-type flash memories 100 in the above-described first embodiment. In the following description, only points different from those in the first embodiment are described.

2.1 Configuration

Figure 18:
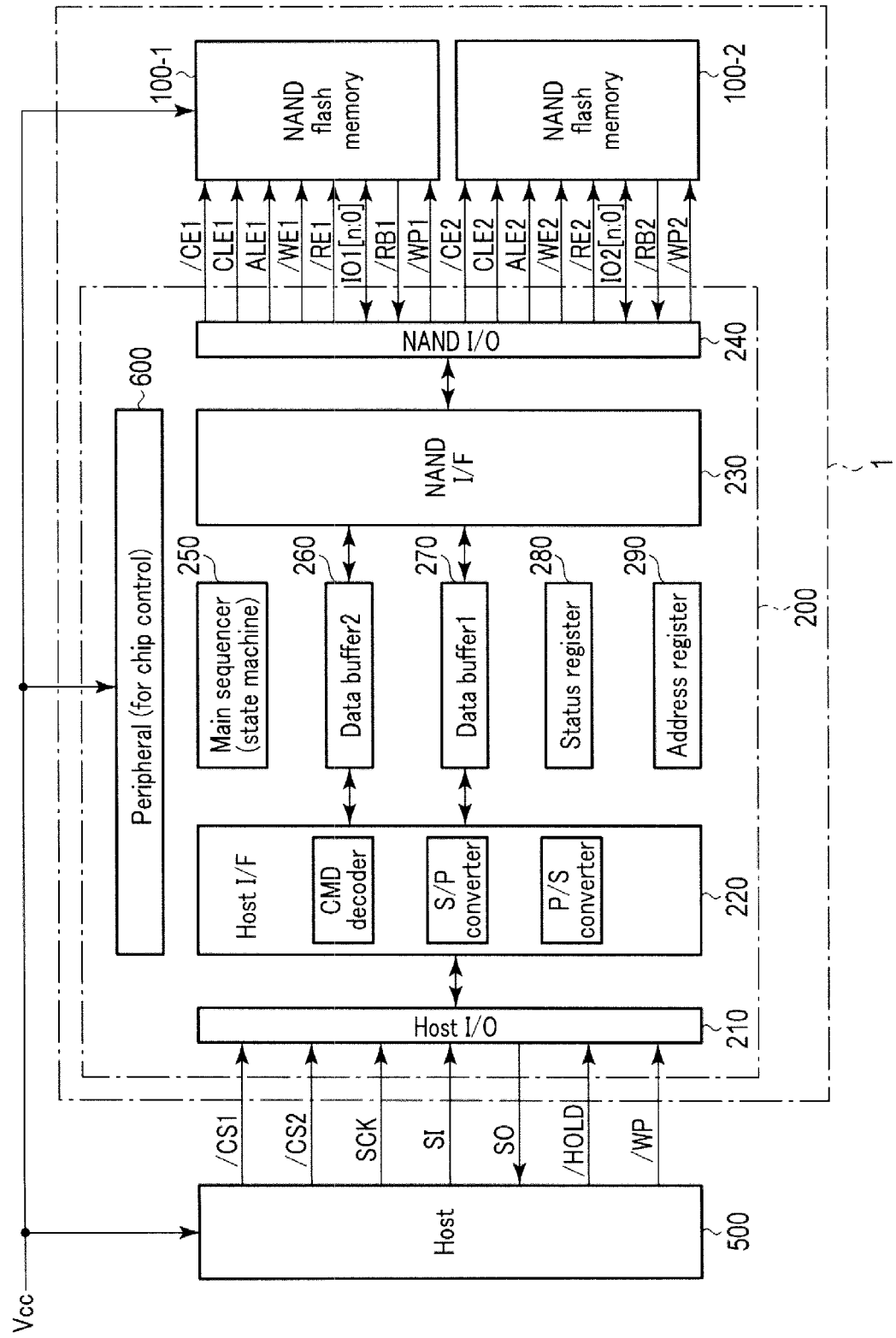
FIG. 18 is a block diagram of a memory system according to a second embodiment.

FIG. 18 is a block diagram of a memory system 1 according to the present embodiment. As illustrated, the memory system 1 includes one controller chip 200 and a plurality of memory chips 100-1 and 100-2, which are controlled by the controller chip 200.

Unlike the case of the first embodiment, both the signals /CS1 and /CS2 are received by the host input-output circuit 210 of the controller 200. Then, the host interface circuit 220, the sequencer 250, and the NAND interface circuit 230 control two NAND-type flash memories 100-1 and 100-2 based on signals received from the host device 500.

2.2 Operation

In an operation of the controller 200 according to the present embodiment, a single controller 200 performs processing that would be performed by the controllers 200-1 and 200-2 in the first embodiment described with reference to FIG. 6.

More specifically, when the asserted signal /CS1 sent from the host 500 is received by the host interface circuit 220, the sequencer 250 causes the NAND interface circuit 230 to assert the signal /CE1. Then, an instruction for reading, writing, or erasure is issued to the NAND-type flash memory 100-1. On the other hand, when the asserted signal /CS2 is received by the host interface circuit 220, the sequencer 250 causes the NAND interface circuit 230 to assert the signal /CE2. Then, an instruction for reading, writing, or erasure is issued to the NAND-type flash memory 100-2.

In this way, according to the received signals /CS1 and /CS2, the host interface circuit 220 or the sequencer 250 determines a memory chip 100 to be activated.

2.3 Advantageous Effect in the Present Embodiment

As in the present embodiment, one controller chip 200 can control a plurality of memory chips 100. Moreover, according to the present embodiment, the number of controller chips 200 in a package can be decreased. Accordingly, wire bonding in a package can be simplified.

3. Modification Examples, Etc

As described above, a memory system according to the above-described embodiments includes a first pin (Pin No. 7 in FIGS. 1 and 3), which receives a first chip select signal (/CS1 in FIGS. 1 and 3) from a host device, a second pin (Pin No. 11 in FIGS. 1 and 3), which receives a second chip select signal (/CS2 in FIGS. 1 and 3) from the host device, a third pin (Pin No. 8 in FIGS. 1 and 3), which outputs a first signal (SO in FIGS. 1 and 3) to the host device, a fourth pin (Pin No. 15 in FIGS. 1 and 3), which receives a second signal (SI in FIGS. 1 and 3) from the host device, a fifth pin (Pin No. 16 in FIGS. 1 and 3), which receives a clock signal (SCK in FIGS. 1 and 3) from the host device, an interface circuit (210, 220 in FIG. 4), which recognizes, as a command, the second signal (SI) received by the fourth pin immediately after the first or second chip select signal (/CS1 or /CS2) asserted is received, and first and second memory cell arrays (110 of 100-1 and 100-2 in FIG. 4) including memory cells capable of holding data. Then, the interface circuit (210, 220) and the first and second memory cell arrays (110 of 100-1 and 100-2) are packaged in a same package (FIGS. 1 and 2). Moreover, the interface circuit (210, 220) accesses the first memory cell array (110 of 100-1) when the first chip select signal (/CS1) is asserted, and accesses the second memory cell array (110 of 100-2) when the second chip select signal (/CS2) is asserted (FIG. 6).

Structurally, a first interface circuit is mounted on a first semiconductor chip (200-1), a second interface circuit is mounted on a second semiconductor chip (200-2) different from the first semiconductor chip, the first memory cell array (110 of 100-1) is mounted on a third semiconductor chip (100-1) different from the first and second semiconductor chips, and the second memory cell array (110 of 100-2) is mounted on a fourth semiconductor chip (100-2) different from the first to third semiconductor chips. Furthermore, the first interface circuit (200-1) asserts a first chip enable signal (/CE1), which activates the third semiconductor chip (100-1), when the first chip select signal (/CS1) is asserted, and the second interface circuit (200-2) asserts a second chip enable signal (/CE2), which activates the fourth semiconductor chip (100-2), when the second chip select signal (/CS2) is asserted.

Alternatively, the interface circuit is mounted on a first semiconductor chip (200 in FIG. 18), the first memory cell array is mounted on a second semiconductor chip (100-1) different from the first semiconductor chip, and the second memory cell array is mounted on a third semiconductor chip (100-2) different from the first and second semiconductor chips. The interface circuit (200) asserts a first chip enable signal (/CE1), which activates the second semiconductor chip (100-1), when the first chip select signal (/CS1) is asserted, and asserts a second chip enable signal (/CE2), which activates the third semiconductor chip (100-2), when the second chip select signal (/CS2) is asserted.

According to the above-described configuration, since a plurality of chip select signals are provided, in a NAND-type flash memory package including a serial interface, a plurality of memory chips 100 can be mounted, and the memory capacity of a memory system 1 can be readily increased while the area occupied on the mounting substrate by the plurality of memory chips 100 is prevented from significantly increasing.

Furthermore, the above-described embodiments are not limiting, but can be modified or altered in various manners. For example, in the above-described embodiments, an example has been described in which two memory chips 100 are included in one memory system (package). However, three or more memory chips 100 can be included in one memory system. In this case, controller chips 200 can be provided in the same number as that of memory chips 100, or one controller chip can control all of the memory chips 100. However, a pairing of the memory chip 100 and the controller chip 200 can be freely selected. For example, when two controller chips 200-1 and 200-2 and four memory chips 100-1 to 100-4 are provided, the controller chip 200-1 can control three memory chips 100-1 to 100-3 and the controller chip 200-2 can control the memory chip 100-4.

Moreover, the method of stacking memory chips 100 and controller chips 200 in layers can be freely selected and is not limited to the configuration described with reference to FIGS. 1 and 2. The size of the controller chip 200 is commonly smaller than that of the memory chip 100. Accordingly, referring to FIGS. 1 and 2, two controller chips 200-1 and 200-2 are mounted on the memory chip 100-2. However, for example, the controller chip 200-2 can be mounted on the controller chip 200-1. Furthermore, although, in FIGS. 1 and 2, an example in which semiconductor chips are stacked in layers in a step-like manner is illustrated, the step-like manner is not necessarily employed. For example, in a case where the memory chips 100-1 and 100-2 have the same size, the two can be located so as to overlappingly align each other. In this case, the electrical connection between memory chips 100 can be attained by using a through-silicon via (TSV) that passes through the memory chips 100. Additionally, flip-chip mounting can be employed as an example of packaging with no use of wire bonding, or sealing using a resin can be omitted. In this case, the package size becomes almost equal to the chip size, so that the package size can be further reduced.

Figure 19:
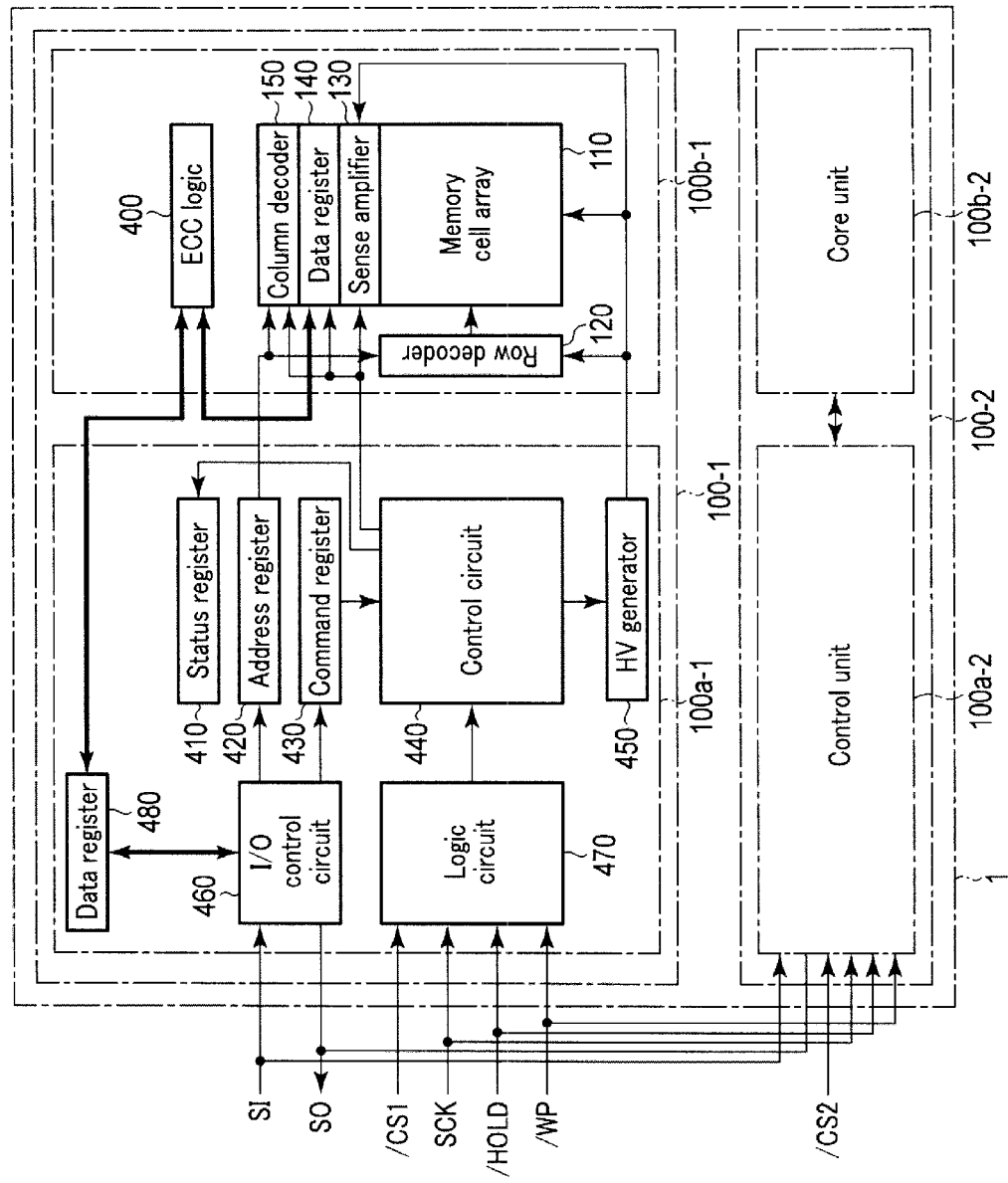
FIG. 19 is a block diagram of a memory system according to a modification example of the first and second embodiments.

Furthermore, in the above-described embodiments, an example has been described in which the NAND-type flash memory 100 and the controller 200 are separate semiconductor chips. However, these device elements can be formed into one chip. The block diagram of the memory system 1 in this case is illustrated in FIG. 19. FIG. 19 illustrates the case where the separate NAND-type flash memory 100 and controller 200 of FIG. 4 in the first embodiment are formed into one chip.

As illustrated, in a block configuration, the controllers 200-1 and 200-2 are omitted as compared to FIG. 4, and the block configuration is similar to the configuration of the memory chip 100 illustrated in FIG. 5. Then, in the memory chip 100, for example, the registers 410, 420, 430, and 480, the control circuit 440, the input-output control circuit 460, the logic circuit 470, and the voltage generation circuit 450 function as a controller 200-1, which is hereinafter referred to as a "controller unit 100a (100a-1 and 100a-2, 100a-1 shown in detail, it being understood that 100a-2 has the same construct as 100a-1)". Additionally, the remaining region is referred to as a "core unit 100b (100b-1 and 100b-2)".

The signals SCK, /CS, /HOLD, and /WP sent from the host device 500 are input to the logic circuit 470, and the signals SI and SO are input and output via the input-output control circuit 460. Then, the control circuit 440 functions as the sequencer 250 and the host interface circuit 220, and discriminates the destination or use of the instructions sent from the host device 500 based on the signal /CS. The input-output control circuit 460 and the logic circuit 470 function as the host input-output circuit 210. The registers 410 and 420 function as the registers 280 and 290, and the feature table is held, for example, in the status register 410.

When the signal /CS1 is asserted, the controller unit 100a-1 accesses the core unit 100b-1. On the other hand, when the signal /CS2 is asserted, the controller unit 100a-2 accesses the core unit 100b-2.

Figure 20:
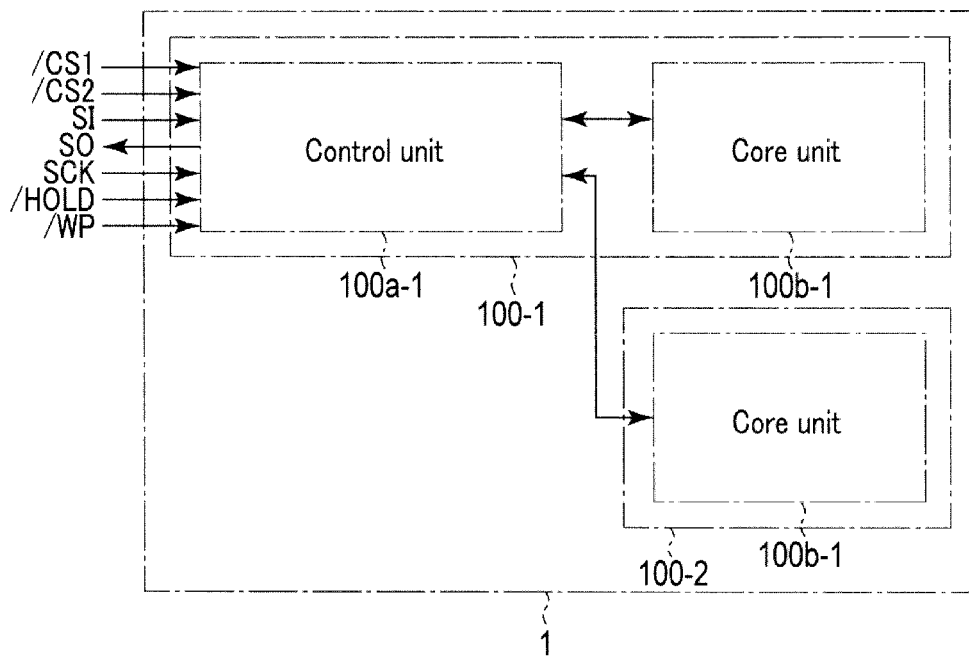
FIG. 20 is a block diagram of a memory system according to a modification example of the first and second embodiments.

FIG. 20 illustrates that the NAND-type flash memories 100 (the NAND-type flash memory 100-1 in the case of FIG. 20) and the controller 200 are formed into one chip in the illustration of FIG. 18 described in the second embodiment. In this case, the memory chip 100-2 does not include any controller unit 100a, but includes a core unit 100b-2, which is controlled by the controller unit 100a-1 of the memory chip 100-1. In this example, the controller unit 100a-1 functions as the controller 200 illustrated in FIG. 18.

Furthermore, the order of processing operations in the flowchart described in the above-described embodiment can be changed where possible. Moreover, the timing charts illustrated in the above-described embodiments are merely examples, and the number of clocks required in inputting the signal SI and the number of clocks required in outputting the signal SO are also not limited to those in the above-described embodiments. Additionally, although an example has been described in which, depending on commands, dummy bits are input immediately after a command, this case is not limiting. Furthermore, the arrangement of pins illustrated in FIG. 3 is merely an example. Although, in the above-described embodiments, an example has been described in which the eleventh pin is used to receive the signal /CS2, another unused pin can be used.

Figure 21:
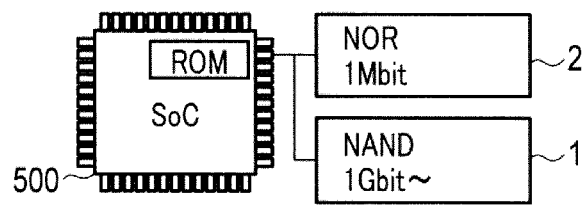
FIG. 21 is a conceptual diagram of a system in which the memory system according to one of the first and second embodiments is used.

Moreover, the memory system described in the above-described embodiments can be used to invoke, for example, applications for television sets, set-top boxes, etc. FIG. 21 illustrates an example of such a system. In the case of this example, a NOR-type flash memory 2 is provided in addition to the memory system 1, and both the memory system 1 and the NOR-type flash memory 2 are connected in common to the host device 500 via the SPI interface. In this example, commands used to control the memory system 1 (for example, commands CMD_RD1, CMD_RD2, CMD_GF, and CMD_SF) are held in the NOR-type flash memory 2. Then, during starting of the host device 500, the host device 500 reads the above-mentioned command information from the NOR-type flash memory 2 according to a sequence held in a read-only memory (ROM) in the host device 500. Then, using the command information, the host device 500 reads a boot program from the memory system 1, and executes the boot program to invoke an application.

Figure 22:
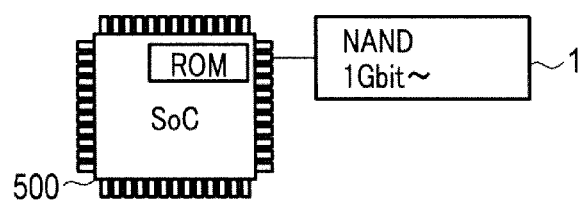
FIG. 22 is a conceptual diagram of a system in which the memory system according to one of the first and second embodiments is used.

Alternatively, in a case where command information on the memory system 1 is held in the ROM of the host device 500, the NOR-type flash memory 2 can be omitted as illustrated in FIG. 22.

Figure 23:
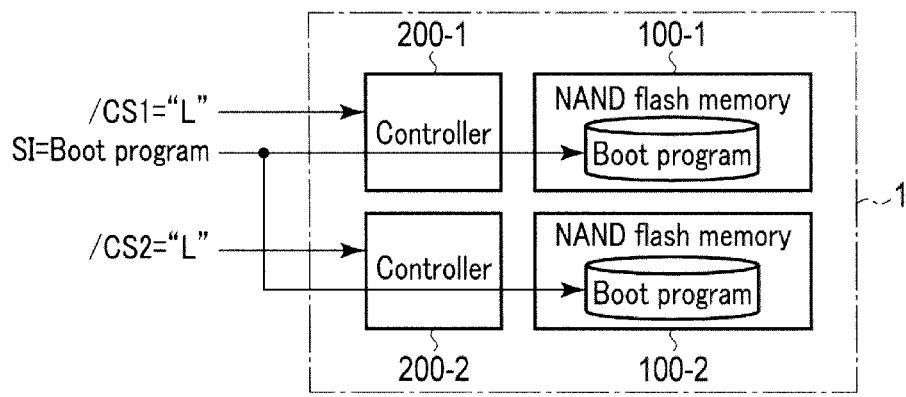
FIG. 23 is a block diagram of the memory system according to one of the first and second embodiments.

FIG. 23 illustrates the manner of writing a boot program to the memory system 1 in the above-mentioned application. As illustrated, the host device 500, another microcomputer, or the like writes a boot program to the NAND-type flash memory 100 prior to shipment of the device. In this instance, both the signals /CS1 and /CS2 are asserted. Then, the boot program is supplied as the input signal SI. As a result, the controllers 200-1 and 200-2 write the same boot program to the NAND-type flash memories 100-1 and 100-2, respectively. Since the boot program is very important information, the boot program can be stored in the memory system 1 in such a multiplexed manner.

Next, a method of reading the boot program in the application is described with reference to FIG. 24. As illustrated, according to the sequence held in the ROM, first, in step S20, the host device 500 asserts the signal /CS1 and reads the boot program from the NAND-type flash memory 100-1. When the boot program has been accurately read (NO in step S21), then in step S22, the host device 500 executes the boot program. When the boot program has not been accurately read (YES in step S21), then in step S23, the host device 500 asserts the signal /CS2 and reads the boot program from the NAND-type flash memory 100-2. When the boot program has been accurately read (NO in step S24), then in step S22, the host device 500 executes the boot program.

Figure 24:
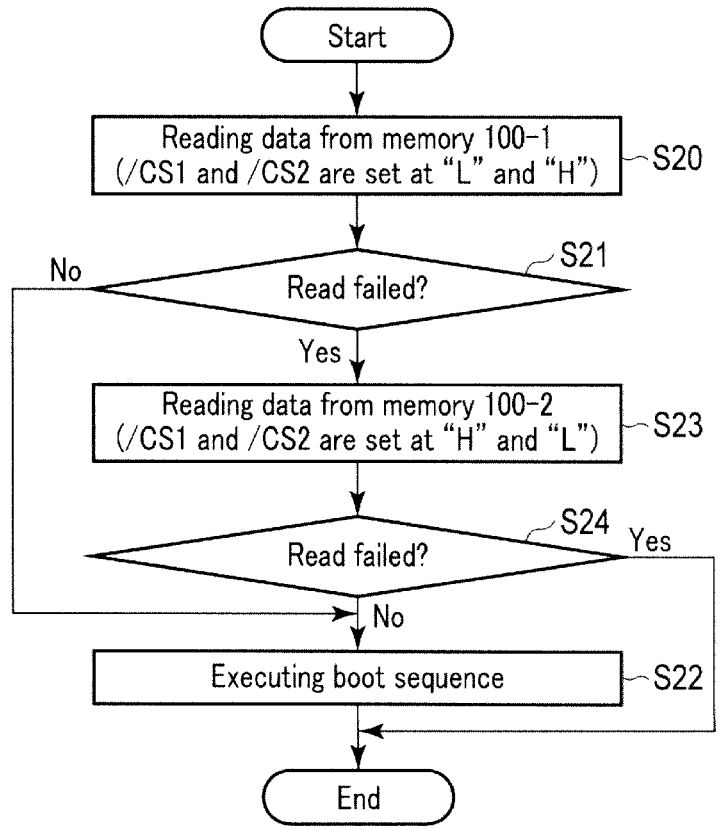
FIG. 24 is a flowchart illustrating a read operation of the memory system according to one of the first and second embodiments.
Figure 25:
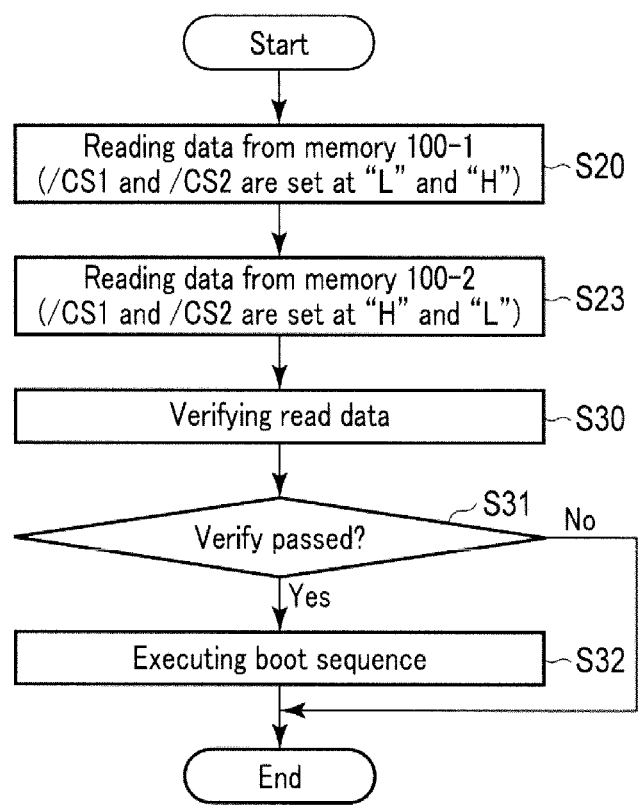
FIG. 25 is a flowchart illustrating a read operation of the memory system according to one of the first and second embodiments.

Alternatively, a method illustrated in FIG. 25 can be used instead of the method illustrated in FIG. 24. As illustrated, according to the sequence held in the ROM, first, in step S20, the host device 500 asserts the signal /CS1 and reads the boot program from the NAND-type flash memory 100-1. Subsequently, in step S23, the host device 500 asserts the signal /C52 and reads the boot program from the NAND-type flash memory 100-2. Then, in step S30, the host device 500 performs verification between the program read in step S20 and the program read in step S23. When both the programs are identical, the host device 500 determines that the read boot program is correct (YES in step S31), and then in step S32, the host device 500 executes the boot program.

An example of the application is not limited to the above-described one, and the memory system according to one embodiment can naturally be applied to various applications. Furthermore, when the same data, which is not limited to a boot program, is to be written to a plurality of memory chips 100, a plurality of corresponding chip select signals /CS can be asserted. Moreover, the same applies to a case where pieces of data stored in a plurality of memory chips 100 are to be erased. Thus, simultaneously performing writing and erasing on a plurality of memory chips 100 enables improving of the operating speed of the device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    first through fifth pins connectable to a host device to output to the host device a first signal through the third pin and to receive from the host device a first chip select signal through the first pin, a second chip select signal through the second pin, a second signal through the fourth pin, and a clock signal through the fifth pin;
an interface circuit configured to recognize, as a command, the second signal received through the fourth pin immediately after detecting the first chip select signal or the second chip select signal; and
a first memory cell array and a second memory cell array each comprising memory cells capable of holding data,
wherein the interface circuit, the first memory cell array, and the second memory cell array are provided in one common package,
the interface circuit includes:
a first interface circuit configured to receive the first chip select signal, the first signal, the second signal, and the clock signal, and to access the first memory cell array when detecting the first chip select signal; and
a second interface circuit configured to receive the second chip select signal, the first signal, the second signal, and the clock signal, and to access the second memory cell array when detecting the second chip select signal, and
the first interface circuit and the second interface circuit commonly share the third through fifth pins.

2. The memory system according to claim 1, wherein
the first interface circuit is part of a first semiconductor chip,
the second interface circuit is part of a second semiconductor chip different from the first semiconductor chip,
the first memory cell array is part of a third semiconductor chip different from the first semiconductor chip and the second semiconductor chip,
the second memory cell array is part of a fourth semiconductor chip different from the first semiconductor chip, the second semiconductor chip, and the third semiconductor chip,
the first interface circuit is configured to assert a first chip enable signal to activate the third semiconductor chip when the first chip select signal is asserted, and
the second interface circuit is configured to assert a second chip enable signal to activate the fourth semiconductor chip when the second chip select signal is asserted.

3. The memory system according to claim 2, wherein
the first through fourth semiconductor chips are stacked in layers and sealed with a resin.

4. The memory system according to claim 1, wherein
the first interface circuit and the first memory cell array are mounted in a first semiconductor chip, and
the second interface circuit and the second memory cell array are mounted in a second semiconductor chip.

5. The memory system according to claim 1, wherein
the first interface circuit and the first memory cell array are mounted in a first semiconductor chip, and
the second memory cell array is mounted in a second semiconductor chip.

6. The memory system according to claim 5, wherein
the first semiconductor chip and the second semiconductor chip are packaged by being stacked one over the other and sealed with a resin.

7. The memory system according to claim 1, wherein
the interface circuit is part of a first semiconductor chip,
the first memory cell array is part of a second semiconductor chip different from the first semiconductor chip,
the second memory cell array is part of a third semiconductor chip different from the first semiconductor chip and the second semiconductor chip, and
the interface circuit is configured to assert a first chip enable signal to activate the second semiconductor chip when the first chip select signal is asserted, and to assert a second chip enable signal to activate the third semiconductor chip when the second chip select signal is asserted.

8. The memory system according to claim 7, wherein
the first, second and third semiconductor chips are stacked in layers and sealed with a resin.

9. The memory system according to claim 1, wherein
the host device is configured to read second data from the second memory cell array when having failed to read first data from the first memory cell array.

10. The memory system according to claim 1, wherein
the host device is configured to perform verification between first data read from the first memory cell array and second data read from the second memory cell array, and execute the first data or the second data according to a result of the verification.

11. The memory system according to claim 10, wherein
the first data and the second data are identical, and are a boot program for the host device.

12. The memory system according to claim 1, wherein
the interface circuit is configured to receive the second signal in synchronization with the clock signal, and recognize, as the command, the first second signal received in synchronization with the clock signal received after the first select signal or the second chip select signal is asserted.

13. The memory system according to claim 1, wherein
the interface circuit is connectable to the host device via a bus conforming to a Serial Peripheral Interface (SPI).

14. A method of operating a semiconductor device having first through fifth pins connectable to a host device for outputting to the host device a first signal through the third pin and for receiving from the host device a first chip select signal through the first pin, a second chip select signal through the second pin, a second signal through the fourth pin, and a clock signal through the fifth pin, an interface circuit configured to recognize, as a command, the second signal received through the fourth pin immediately after detecting the first chip select signal or the second chip select signal, and a first memory cell array and a second memory cell array each comprising memory cells capable of holding data, wherein the interface circuit, the first memory cell array, and the second memory cell array are provided in one common package, and the interface circuit includes: a first interface circuit configured to receive the first chip select signal, the first signal, the second signal, and the clock signal, and to access the first memory cell array; and a second interface circuit configured to receive the second chip select signal, the first signal, the second signal, and the clock signal, and to access the second memory cell array, and the first interface circuit and the second interface circuit commonly share the third through fifth pins, said method comprising:
upon detecting the first chip select signal using the first interface circuit, accessing the first memory cell array using the first interface circuit; and
upon detecting the second chip select signal using the second interface circuit, accessing the second memory cell array using the second interface circuit.

15. The method according to claim 14, wherein
the first interface circuit is part of a first semiconductor chip,
the second interface circuit is part of a second semiconductor chip different from the first semiconductor chip, the first memory cell array is part of a third semiconductor chip different from the first semiconductor chip and the second semiconductor chip, the second memory cell array is part of a fourth semiconductor chip different from the first semiconductor chip, the second semiconductor chip, and the third semiconductor chip, the first interface circuit is configured to assert a first chip enable signal to activate the third semiconductor chip when the first chip select signal is asserted, and the second interface circuit is configured to assert a second chip enable signal to activate the fourth semiconductor chip when the second chip select signal is asserted.

16. The method according to claim 15, wherein the first through fourth semiconductor chips are stacked in layers and sealed with a resin.

17. The method according to claim 14, further comprising:

the interface circuit is part of a first semiconductor chip, the first memory cell array is part of a second semiconductor chip different from the first semiconductor chip, the second memory cell array is part of a third semiconductor chip different from the first semiconductor chip and the second semiconductor chip, and the interface circuit is configured to assert a first chip enable signal to activate the second semiconductor chip when the first chip select signal is asserted, and to assert a second chip enable signal to activate the third semiconductor chip when the second chip select signal is asserted.

18. The method according to claim 17, wherein the first, second and third semiconductor chips are stacked in layers and sealed with a resin.

* * * * *